United States Patent
Tsai et al.

(10) Patent No.: US 11,239,173 B2
(45) Date of Patent: Feb. 1, 2022

(54) STRUCTURE AND FORMATION METHOD OF CHIP PACKAGE WITH FAN-OUT FEATURE

(71) Applicant: Taiwan Semiconductor Manufacturing Co., Ltd., Hsinchu (TW)

(72) Inventors: Po-Hao Tsai, Zhongli (TW); Meng-Liang Lin, Hsinchu (TW); Po-Yao Chuang, Hsin-Chu (TW); Techi Wong, Zhubei (TW); Shin-Puu Jeng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/446,796

(22) Filed: Jun. 20, 2019

(65) Prior Publication Data
US 2020/0312773 A1    Oct. 1, 2020

Related U.S. Application Data

(60) Provisional application No. 62/825,072, filed on Mar. 28, 2019.

(51) Int. Cl.
*H01L 21/98* (2006.01)
*H01L 23/538* (2006.01)
(Continued)

(52) U.S. Cl.
CPC ...... *H01L 23/5389* (2013.01); *H01L 21/4857* (2013.01); *H01L 21/568* (2013.01);
(Continued)

(58) Field of Classification Search
CPC . H01L 23/5389; H01L 25/50; H01L 23/3128; H01L 21/4857; H01L 21/568;
(Continued)

(56) References Cited

U.S. PATENT DOCUMENTS

| 9,000,584 B2 | 4/2015 | Lin et al. |
| 9,048,222 B2 | 6/2015 | Hung et al. |

(Continued)

FOREIGN PATENT DOCUMENTS

| CN | 107799499 A | 3/2018 |
| CN | 109860123 A | 6/2019 |
| TW | 201906103 A | 2/2019 |

OTHER PUBLICATIONS

Taiwan Office action dated Aug. 25, 2020, issued in application No. 109104943.
(Continued)

*Primary Examiner* — Samuel Park
(74) *Attorney, Agent, or Firm* — McClure, Qualey & Rodack, LLP

(57) ABSTRACT

A package structure and a formation method of a package structure are provided. The method includes forming a redistribution structure over a carrier substrate and disposing a semiconductor die over the redistribution structure. The method also includes stacking an interposer substrate over the redistribution structure. The interposer substrate extends across edges of the semiconductor die. The method further includes disposing one or more device elements over the interposer substrate. In addition, the method includes forming a protective layer to surround the semiconductor die.

20 Claims, 41 Drawing Sheets

(51) Int. Cl.
*H01L 21/48* (2006.01)
*H01L 23/31* (2006.01)
*H01L 25/00* (2006.01)
*H01L 25/18* (2006.01)
*H01L 21/56* (2006.01)

(52) U.S. Cl.
CPC .......... *H01L 23/3128* (2013.01); *H01L 25/18* (2013.01); *H01L 25/50* (2013.01)

(58) Field of Classification Search
CPC .......... H01L 25/18; H01L 2224/45015; H01L 25/105; H01L 24/19; H01L 24/16; H01L 23/49816; H01L 25/0657; H01L 27/73; H01L 23/49811; H01L 24/13; H01L 23/49827; H01L 24/32; H01L 24/81; H01L 24/20; H01L 21/6835; H01L 24/92; H01L 21/561; H01L 23/5383; H01L 25/0652; H01L 25/0655; H01L 24/17; H01L 24/83; H01L 21/4853; H01L 24/48; H01L 21/565; H01L 24/49822; H01L 23/49838; H01L 23/5385; H01L 21/56; H01L 24/05; H01L 2224/73204; H01L 2224/16225; H01L 2224/32225; H01L 2924/00; H01L 24/73; H01L 24/97; H01L 21/486
See application file for complete search history.

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,607,967 B1* | 3/2017 | Shih | H01L 25/0657 |
| 9,859,253 B1* | 1/2018 | Jayaraman | H01L 25/50 |
| 10,546,830 B2 | 1/2020 | Jeng et al. | |
| 10,804,244 B2 | 10/2020 | Jeng et al. | |
| 2008/0185719 A1 | 8/2008 | Cablao et al. | |
| 2014/0367854 A1 | 12/2014 | Zhao et al. | |
| 2015/0162265 A1* | 6/2015 | Jo | H01L 24/97 257/774 |
| 2015/0171006 A1* | 6/2015 | Hung | H01L 23/5384 257/774 |
| 2015/0303174 A1* | 10/2015 | Yu | H01L 21/6835 257/712 |
| 2015/0325556 A1* | 11/2015 | Lai | H01L 25/105 257/777 |
| 2015/0371936 A1 | 12/2015 | Chen et al. | |
| 2016/0049385 A1* | 2/2016 | Yu | H01L 24/19 257/774 |
| 2016/0190107 A1 | 6/2016 | Meyer et al. | |
| 2016/0260684 A1* | 9/2016 | Zhai | H01L 21/568 |
| 2016/0276307 A1 | 9/2016 | Lin | |
| 2016/0300817 A1* | 10/2016 | Do | H01L 24/20 |
| 2016/0343695 A1* | 11/2016 | Lin | H01L 21/565 |
| 2016/0358889 A1* | 12/2016 | Lai | H01L 21/768 |
| 2017/0092617 A1* | 3/2017 | Wu | H01L 21/561 |
| 2017/0263518 A1* | 9/2017 | Yu | H01L 24/16 |
| 2018/0012857 A1 | 1/2018 | Lin | |
| 2018/0102313 A1* | 4/2018 | Shih | H01L 21/6835 |
| 2019/0164893 A1 | 5/2019 | Kim et al. | |

OTHER PUBLICATIONS

Chinese language office action dated Sep. 9, 2021, issued in application No. CN 202010084354.4.

* cited by examiner

STRUCTURE AND FORMATION METHOD OF CHIP PACKAGE WITH FAN-OUT FEATURE

PRIORITY CLAIM AND CROSS-REFERENCE

This Application claims the benefit of U.S. Provisional Application No. 62/825,072, filed on Mar. 28, 2019, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
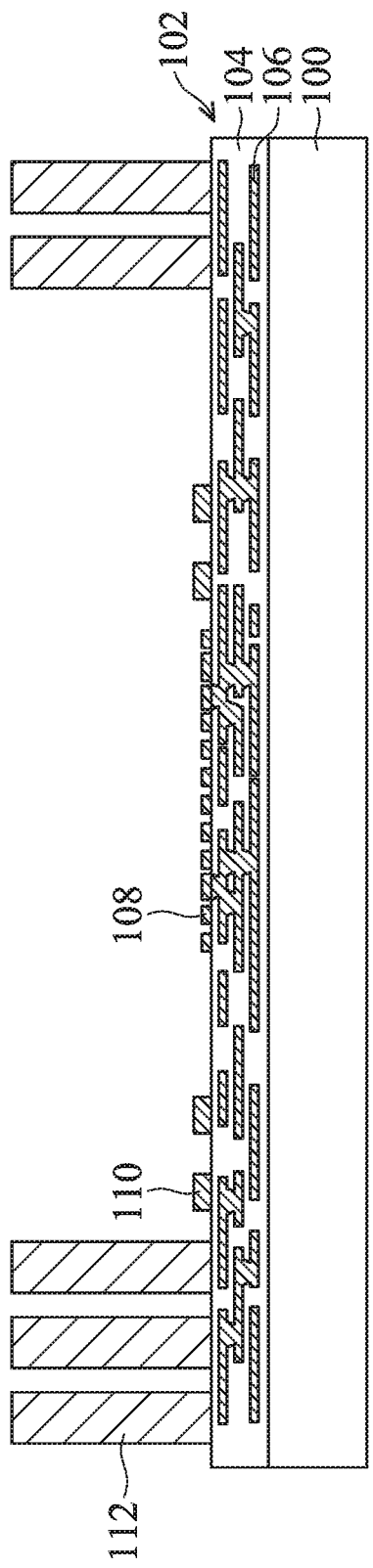
FIGS. 1A-1G are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1G are cross-sectional views of various stages of a process for forming a package structure, in accordance with some embodiments. As shown in FIG. 1A, a redistribution structure 102 is formed over a carrier substrate 100, in accordance with some embodiments. The carrier substrate 100 may be a glass substrate, a semiconductor substrate, or another suitable substrate. The redistribution structure 102 may be used for routing. The redistribution structure 102 includes multiple insulating layers 104 and multiple conductive features 106 surrounded by the insulating layers 104. The conductive features 106 may include conductive lines, conductive vias, and/or conductive pads. In some embodiments, some of the conductive vias are stacked with each other. The upper conductive via is substantially aligned with the lower conductive via. In some embodiments, some of the conductive vias are staggered vias. The upper conductive via is misaligned with the lower conductive via.

The redistribution structure 102 also includes conductive elements 108 and 110 that are used to hold or receive other elements. In some embodiments, the conductive elements 108 and 110 are exposed at or protrude from the topmost surface of the insulating layers 104. The conductive elements 108 may be used to hold or receive one or more semiconductor dies. The conductive elements 110 may be used to hold or receive conductive features such as conductive pillars and/or conductive balls.

The insulating layers 104 may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers 104.

In some other embodiments, some or all of the insulating layers 104 are made of or include dielectric materials other than polymer materials. The dielectric material may include silicon oxide, silicon carbide, silicon nitride, silicon oxynitride, one or more other suitable materials, or a combination thereof.

The conductive features 106 may include conductive lines providing electrical connection in horizontal directions and conductive vias providing electrical connection in vertical directions. The conductive features 106 may be made of or include copper, aluminum, gold, cobalt, titanium, nickel, silver, graphene, one or more other suitable conductive materials, or a combination thereof. In some embodiments, the conductive features 106 include multiple sub-layers. For example, each of the conductive features 106 contains multiple sub-layers including Ti/Cu, Ti/Ni/Cu, Ti/Cu/Ti, Al/Ti/Ni/Ag, other suitable sub-layers, or a combination thereof.

The formation of the redistribution structure 102 may involve multiple deposition or coating processes, multiple patterning processes, and/or multiple planarization processes.

The deposition or coating processes may be used to form insulating layers and/or conductive layers. The deposition or coating processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, one or more other applicable processes, or a combination thereof.

Afterwards, conductive pillars 112 are formed over the redistribution structure 102, as shown in FIG. 1A in accordance with some embodiments. Each of the conductive pillars may be electrically connected to one of the conductive features 106. In some embodiments, one or more of the conductive pillars 112 have vertical sidewalls. The extending direction of one of the vertical sidewalls may be substantially perpendicular to the bottom surface of the redistribution structure 102.

The conductive pillars 112 may be made of or include copper, aluminum, gold, cobalt, titanium, tin, one or more other suitable materials, or a combination thereof. The conductive pillars 112 may be formed using an electroplating process, an electroless plating process, a placement process, a printing process, a physical vapor deposition (PVD) process, a chemical vapor deposition (CVD) process, one or more other applicable processes, or a combination thereof.

Figure 1B:
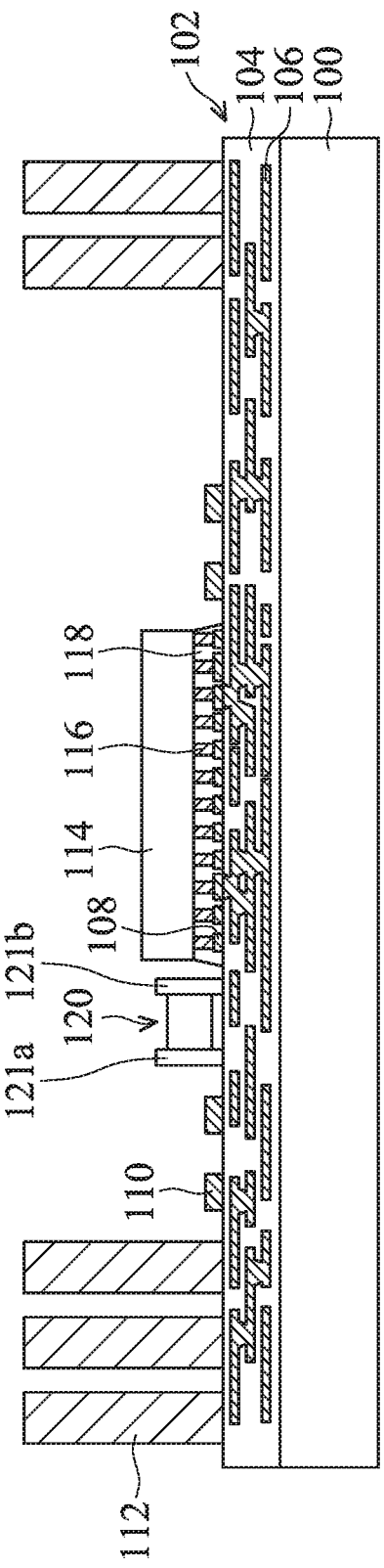

As shown in FIG. 1B, a semiconductor die 114 is stacked over the redistribution structure 102, in accordance with some embodiments. The semiconductor die 114 may include application processors, power management integrated circuits, memory devices, one or more other suitable circuits, or a combination thereof. In some embodiments, the semiconductor die 114 is bonded onto the conductive elements 108 through conductive features 116. The conductive features 116 may include conductive pillars, solder bumps, one or more other suitable bonding structures, or a combination thereof. In some embodiments, an underfill material 118 is formed to surround and protect the conductive features 116.

In some embodiments, one or more device elements 120 are disposed over the redistribution structure 102, as shown in FIG. 1B. The device elements 120 may be bonded onto some of the conductive features 106 of the redistribution structure 102. In some embodiments, the device elements 120 are bonded onto the pad regions (constructed by some of the conductive features 106) of the redistribution structure 102 through solder bumps, conductive pillars, one or more other suitable conductive elements, or a combination thereof. The device elements 120 may include one or more passive elements such as resistors, capacitors, inductors, one or more other suitable elements, or a combination thereof. In some other embodiments, the device elements 120 include memory devices. In some embodiments, the device element 120 includes electrodes 121a and 121b. In some embodiments, the electrodes 121a and 121b of the device element 120 is solder jointed to pad regions of the redistribution structure 102.

Figure 1C:
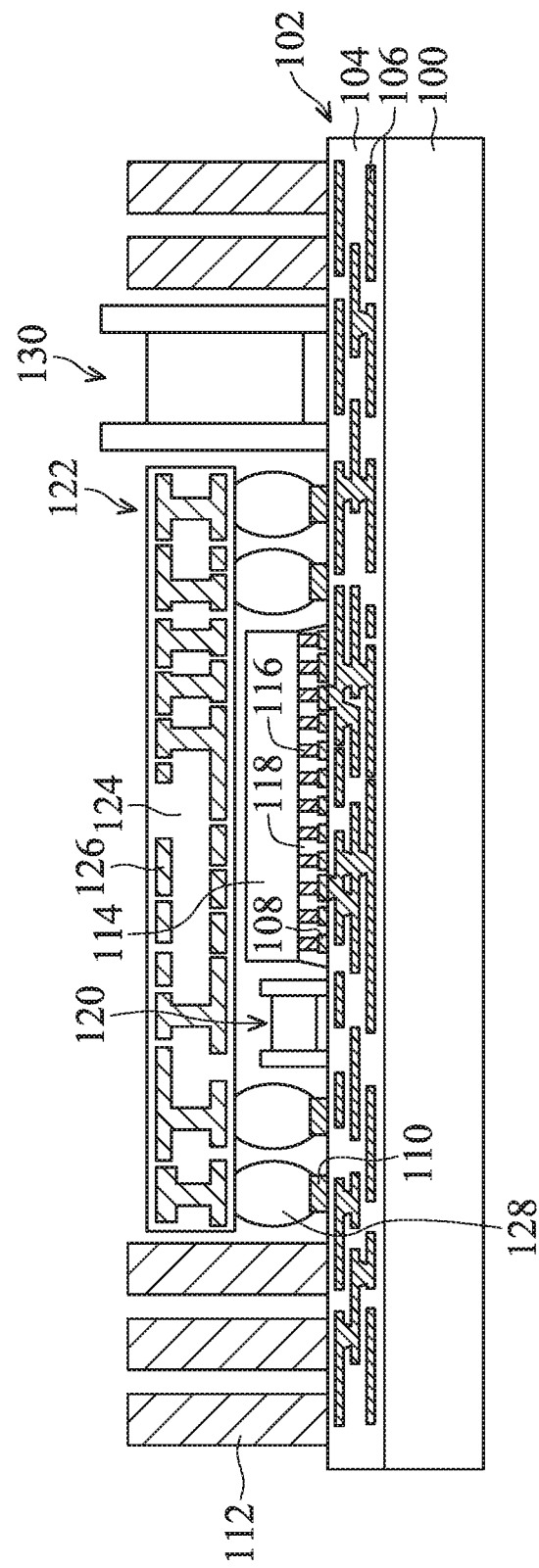

As shown in FIG. 1C, an interposer substrate 122 is stacked over the redistribution structure 102, in accordance with some embodiments. In some embodiments, the interposer substrate 122 extends across edges of the semiconductor die 114. In some embodiments, the interposer substrate 122 is wider than the semiconductor die 114. In some embodiments, the interposer substrate 122 extends across edges of the device element 120. In some embodiments, the interposer substrate 122 is surrounded or encircled by the conductive pillars 112.

In some embodiments, the interposer substrate 122 is bonded to the conductive elements 110 through conductive structures 128, as shown in FIG. 1C. The conductive structures 128 may include solder bumps, conductive pillars, other suitable conductive elements, or a combination thereof. In some embodiments, the interposer substrate 122 is separated from the semiconductor die 114 by a gap, as shown in FIG. 1C.

In some embodiments, the interposer substrate 122 includes a board 124 and conductive elements 126. The conductive elements 126 may be made of or include copper, aluminum, cobalt, nickel, gold, silver, tungsten, one or more other suitable materials, or a combination thereof. The board 124 may be made of or include a polymer material, a ceramic material, a metal material, a semiconductor material, one or more other suitable materials, or a combination thereof. For example, the board 124 includes resin, prepreg, glass, and/or ceramic. In cases where the board 124 is made of a metal material or a semiconductor material, dielectric layers may be formed between the board 124 and the conductive elements 126 to prevent short circuiting.

In cases where the board 124 is made of or includes a polymer material, the board 124 may further include fillers that are dispersed in the polymer material. The polymer material may be made of or include epoxy-based resin, polyimide-based resin, one or more other suitable polymer materials, or a combination thereof. The examples of the fillers may include fibers (such as silica fibers and/or carbon-containing fibers), particles (such as silica particles and/or carbon-containing particles), or a combination thereof.

In some embodiments, the interposer substrate 122 contains more filler than the redistribution structure 102. In some embodiments, the board 124 has a greater weight percentage of fillers than that of the insulating layers 104 of the redistribution structure 102. In some embodiments, the insulating layers 104 of the redistribution structure 102 are made of or include a polymer material. In some embodiments, the insulating layers 104 of the redistribution structure 102 contain no filler. In these cases, the redistribution structure 102 contains no filler.

In some embodiments, the interposer substrate 122 and the carrier substrate 100 are pressed against each other at an elevated temperature. As a result, the interposer substrate 122 is bonded to the redistribution structure 102 through the conductive structures 128. In some embodiments, a thermal compression process is used to achieve the bonding process mentioned above.

As shown in FIG. 1C, a device element 130 is stacked over the redistribution structure 102, in accordance with some embodiments. The device element 130 may be electrically connected to one of the conductive features 106 of the redistribution structure 102. The device element 130 may include passive devices and/or memory devices.

Figure 1D:
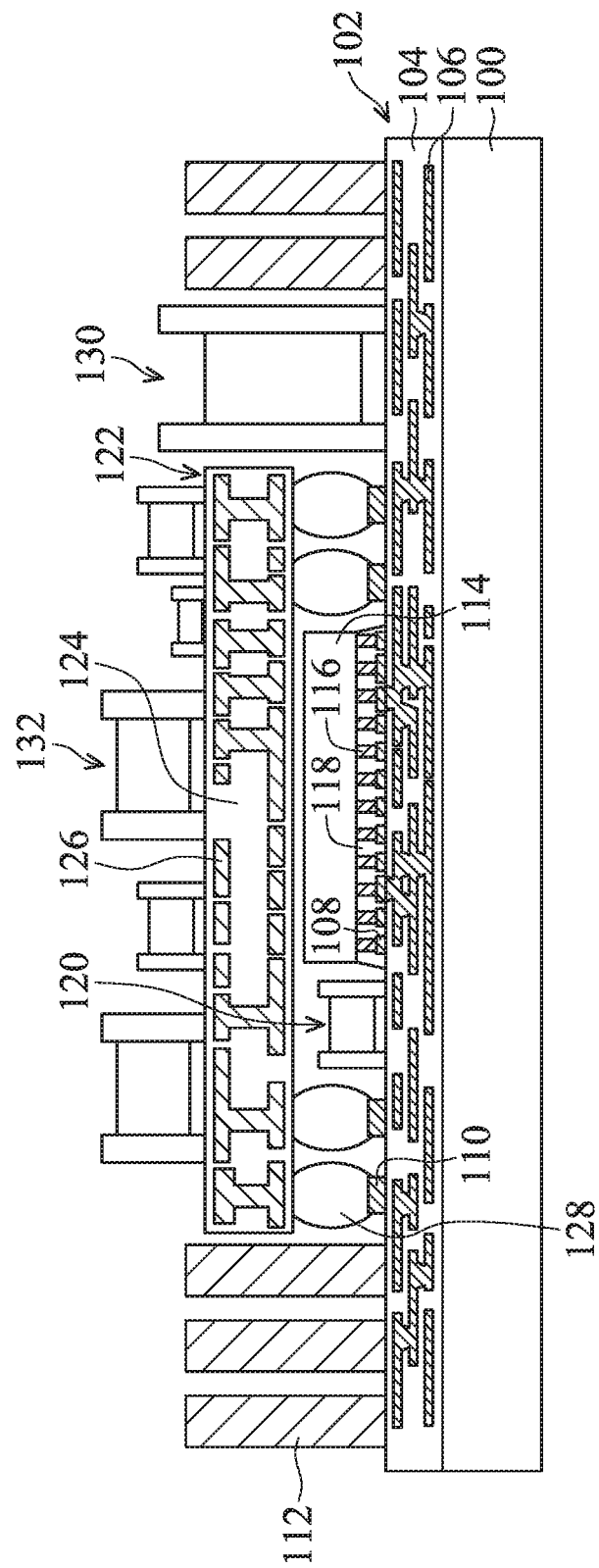

As shown in FIG. 1D, device elements 132 are disposed over the interposer substrate 122, in accordance with some embodiments. The device elements 132 may be bonded and electrically connected to some of the conductive elements 126 of the interposer substrate 122. The device elements 132 may include one or more passive elements such as resistors, capacitors, inductors, one or more other suitable elements, or a combination thereof. In some other embodiments, the device elements 132 include memory devices. Some of the device elements 132 have the same or similar functions. For example, they function as resistors or capacitors. Some of the device elements have different functions. For example, some of the device elements 132 include passive elements, and some other device elements 132 include memory devices.

Figure 1E:
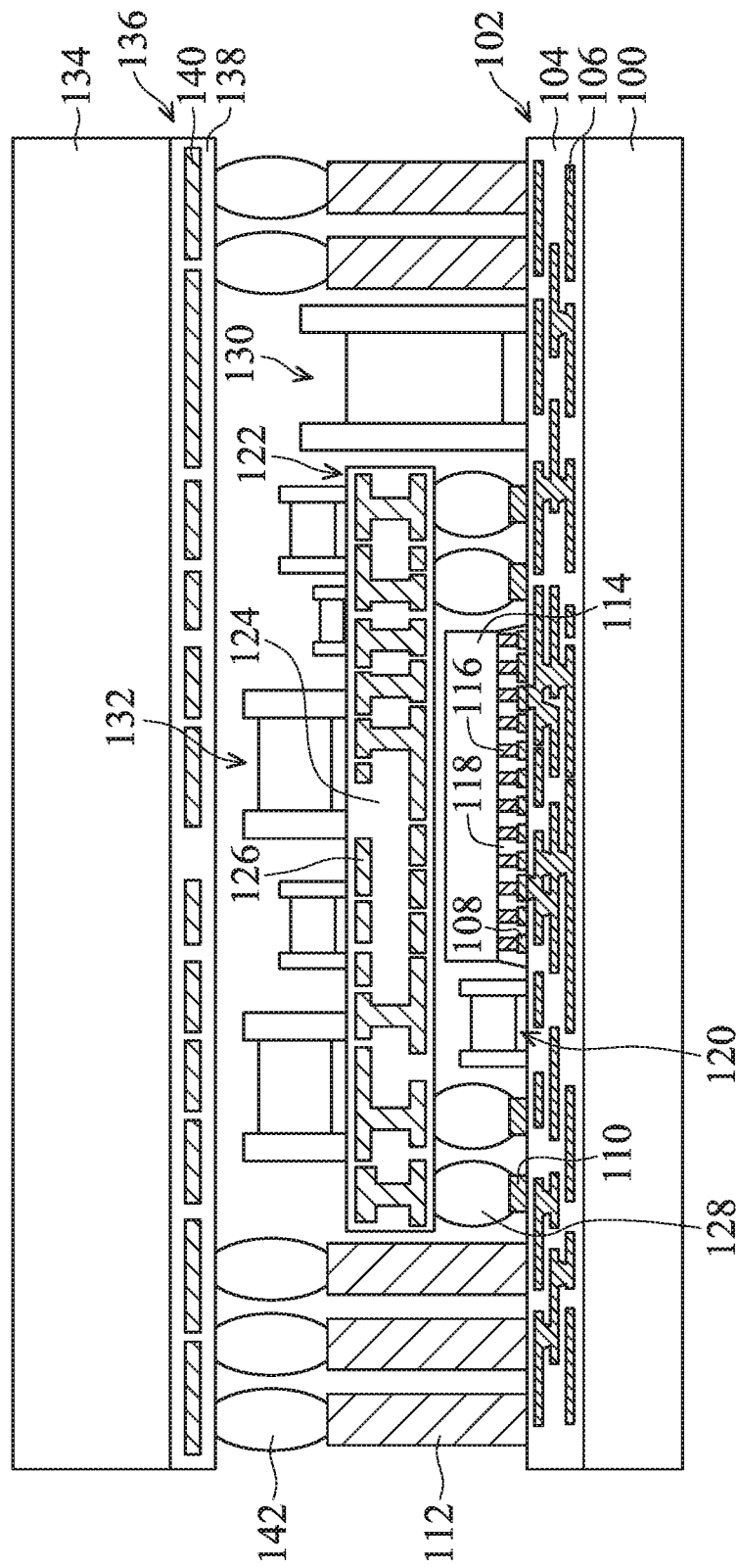

As shown in FIG. 1E, a module 134 carried by an interconnection structure 136 is stacked over the interposer substrate 122, in accordance with some embodiments. In some embodiments, the module 134 extends across edges of the interposer substrate 122. In some embodiments, the interconnection structure 136 extends across the edges of the interposer substrate 122.

In some embodiments, the module 134 is bonded to the redistribution structure 102 through the conductive pillars 112 and the solder elements 142. The solder elements 142 may be made of a tin-containing material. The tin-containing material may further include copper, silver, gold, aluminum, lead, one or more other suitable materials, or a combination thereof. In some other embodiments, the solder elements 142 are lead-free.

In some embodiments, the module 134 is a package module that has one or more semiconductor dies. For example, the package module includes memory dies. In some embodiments, the module 134 is a semiconductor die. For example, the semiconductor die includes memory devices.

In some embodiments, the interconnection structure 136 is an interposer substrate that carries the module 134. In these cases, the interconnection structure 136 has a structure that is similar to that of the interposer substrate 122. In some embodiments, the interconnection structure 136 includes a board 138 and conductive elements 140. The material of the board 138 may be the same as or similar to that of the board 124 of the interposer substrate 122. The material of the conductive elements 140 may be the same as or similar to that of the conductive elements 126 of the interposer substrate 122.

However, embodiments of the disclosure are not limited thereto. Many variations and/or modifications can be made to embodiments of the disclosure. In some other embodiments, the interconnection structure 136 has a structure that is similar to that of the redistribution structure 102.

Figure 1F:
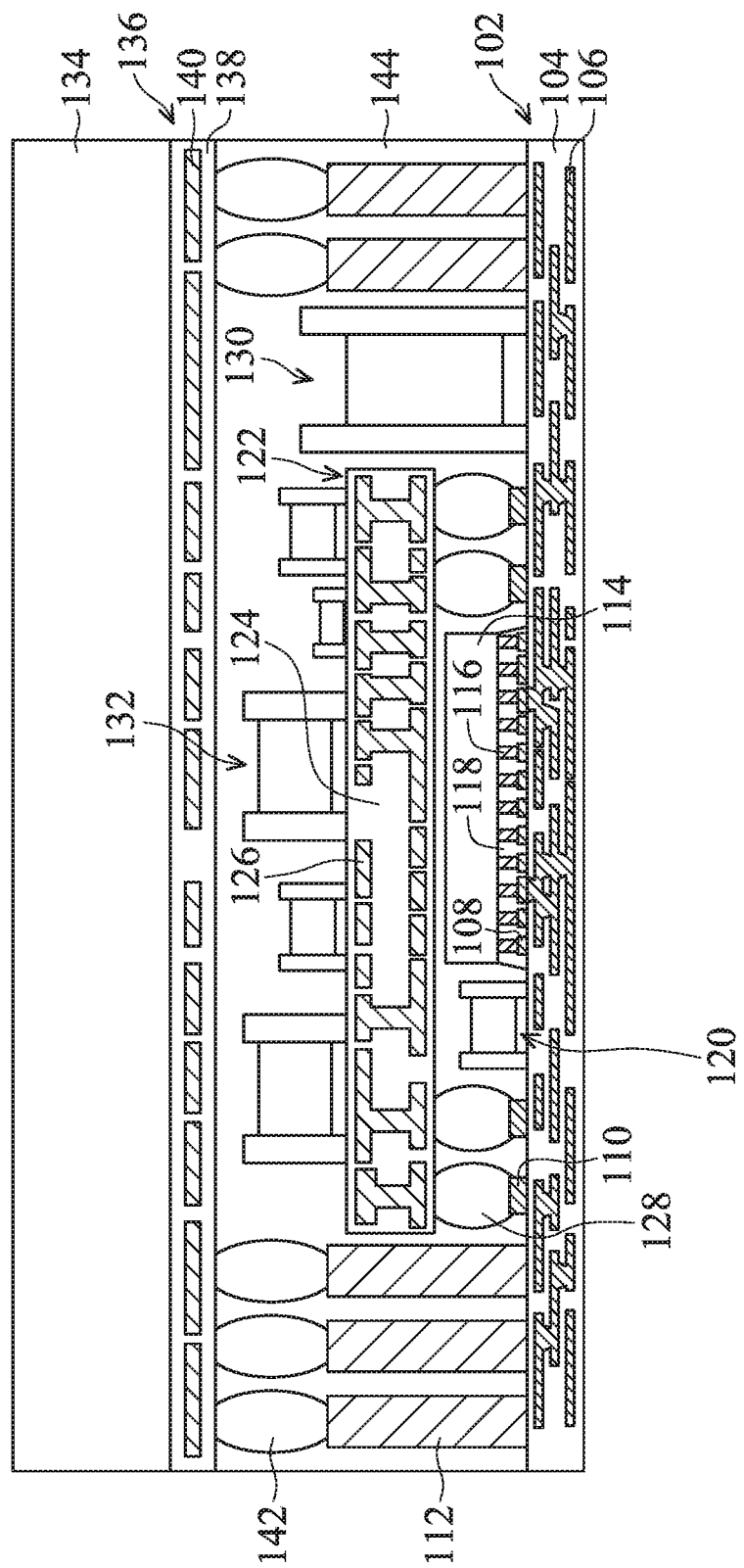

As shown in FIG. 1F, a protective layer 144 is formed to surround and protect the semiconductor die 114, in accordance with some embodiments. In some embodiments, the protective layer 144 also surrounds and protects the interposer substrate 122. In some embodiments, the protective layer 144 further surrounds and protects the device elements 132 mounted on the interposer substrate 122. In some embodiments, the protective layer 144 surrounds and protects the conductive pillars 112 and the solder elements 142. In some embodiments, a portion of the protective layer 144 is between the interconnection structure 136 and the interposer substrate 122, as shown in FIG. 1F. In some embodiments, a portion of the protective layer 144 is between the semiconductor die 114 and the interposer substrate 122.

In some embodiments, the protective layer 144 is separated from the conductive features 116 below the semiconductor die 114 by the underfill material 118. However, embodiments of the disclosure are not limited thereto. Many variations and/or modifications can be made to embodiments of the disclosure. In some other embodiments, the underfill material 118 is not formed. In these cases, the protective layer 144 may be in direct contact with the conductive feature 116 below the semiconductor die 114.

In some embodiments, the protective layer 144 is made of or includes an insulating material such as a molding material. The molding material may include a polymer material, such as an epoxy-based resin with fillers dispersed therein. In some embodiments, a molding material (such as a liquid molding material) is introduced or injected into the space between the interconnection structure 136 and the redistribution structure 102. In some embodiments, a thermal process is then used to cure the liquid molding material and to transform it into the protective layer 144.

Afterwards, the carrier substrate 100 is removed to expose a surface of the redistribution structure 102, as shown in FIG. 1F in accordance with some embodiments.

Figure 1G:
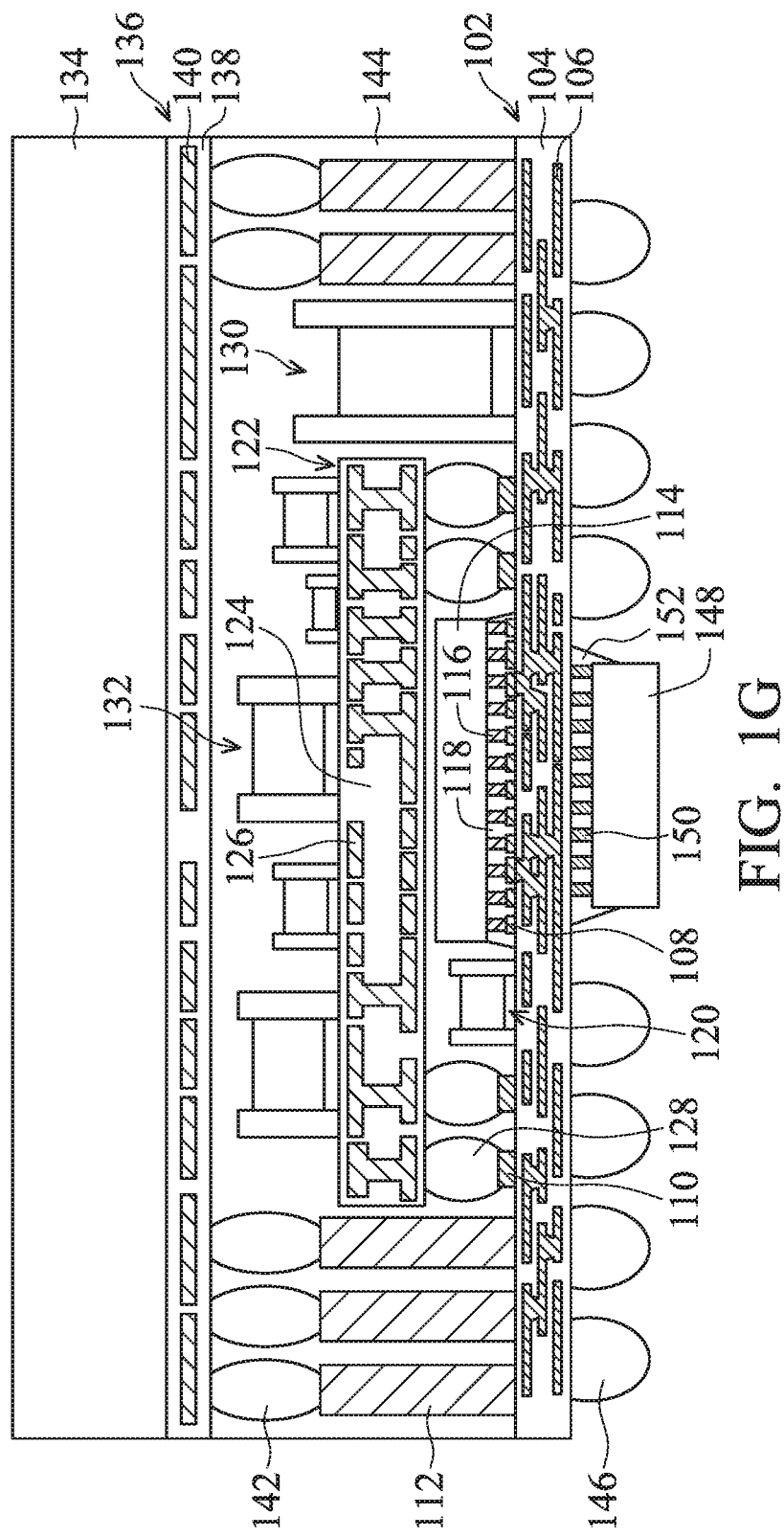

As shown in FIG. 1G, conductive bumps 146 are formed over the surface of the redistribution structure 102 that is originally covered by the carrier substrate 100, in accordance with some embodiments. Each of the conductive bumps 146 may be electrically connected to one of the conductive features 106 of the redistribution structure 102. In some embodiments, the conductive bumps 146 are or include solder bumps such as tin-containing solder bumps. The tin-containing solder bumps may further include copper, silver, gold, aluminum, lead, one or more other suitable materials, or a combination thereof. In some embodiments, the tin-containing solder bump is lead-free.

In some embodiments, solder balls (or solder elements) are disposed on the exposed conductive features 106 after the removal of the carrier substrate 100. A reflow process is then carried out to melt the solder balls into the conductive bumps 146. In some other embodiments, under bump metallization (UBM) elements are formed over the exposed conductive features 106 before the solder balls are disposed. In some other embodiments, solder elements are electroplated onto the exposed conductive features 106. Afterwards, a reflow process is used to melt the solder element to form the conductive bumps 146.

As shown in FIG. 1G, a semiconductor die 148 is then stacked over the surface of the redistribution structure 102 that is originally covered by the carrier substrate 100, in accordance with some embodiments. The semiconductor die 148 may include application processors, power management integrated circuits, memory devices, one or more other suitable circuits, or a combination thereof. In some embodiments, the semiconductor die 148 is bonded onto the redistribution structure 102 through conductive features 150. The conductive features 150 may include conductive pillars, solder bumps, one or more other suitable bonding structures, or a combination thereof. In some embodiments, an underfill material 152 is formed to surround and protect the conductive features 150.

In some other embodiments, one or more other surface mounted devices are formed over the surface of the redistribution structure 102 that is originally covered by the carrier substrate 100. The surface mounted devices may include passive elements and/or memory devices.

In some embodiments, a singulation process is then carried out. As a result, multiple separate package structures are formed. In FIG. 1G, one of the package structures is shown. As shown in FIG. 1G, the semiconductor die 114 is directly above the semiconductor die 148. The semiconductor dies 114 and 148 may communicate with each other through some of the conductive features 106 of the redistribution structure 102. The RC delay and/or signal noise are significantly reduced. The signal transmission speed is improved.

Figure 2:
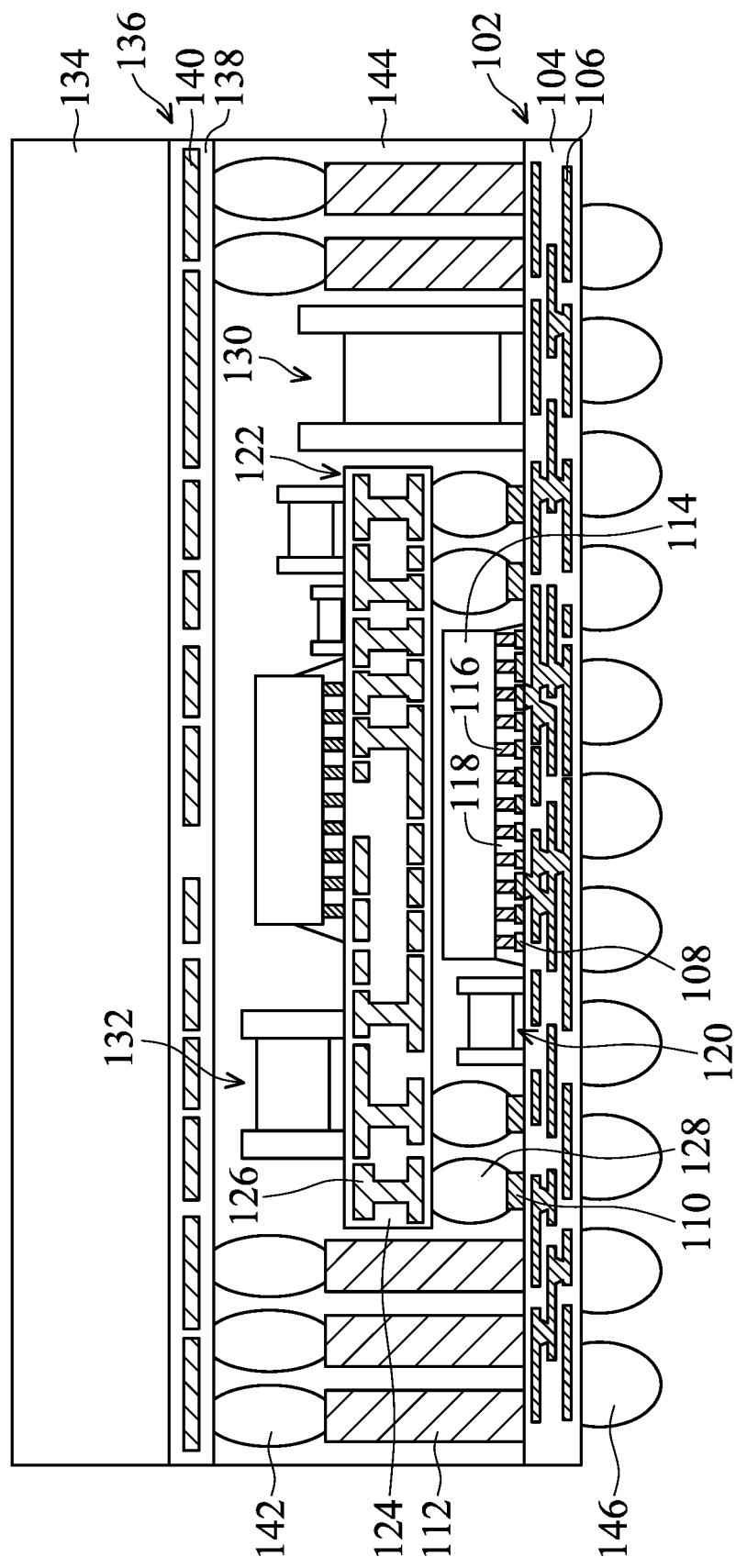
FIG. 2 is a cross-sectional view of a package structure, in accordance with some embodiments.

Many variations and/or modifications can be made to embodiments of the disclosure. FIG. 2 is a cross-sectional view of a package structure, in accordance with some embodiments. In some embodiments, the semiconductor die 148 is not bonded onto the redistribution structure 102.

Many variations and/or modifications can be made to embodiments of the disclosure. FIGS. 3A-3H are cross-sectional views of various stages of a process for forming a package structure, in accordance with some embodiments.

Figure 3A:
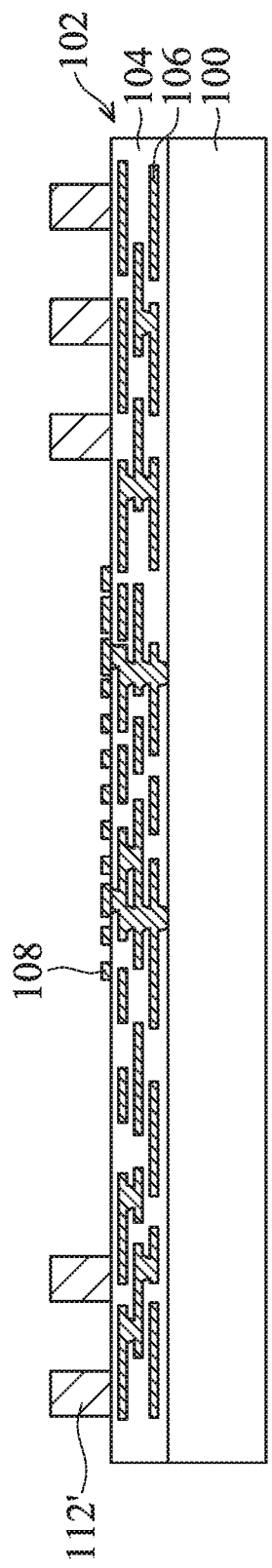
FIGS. 3A-3H are cross-sectional views of various stages of a process for forming a package structure, in accordance with some embodiments.

As shown in FIG. 3A, similar to the embodiments illustrated in FIG. 1A, conductive pillars 112' are formed over the redistribution structure 102 carried by the carrier substrate 100, in accordance with some embodiments. The materials and formation method of the conductive pillars 112' may be the same as or similar to those of the conductive pillars 112 illustrated in FIG. 1A.

Figure 3B:
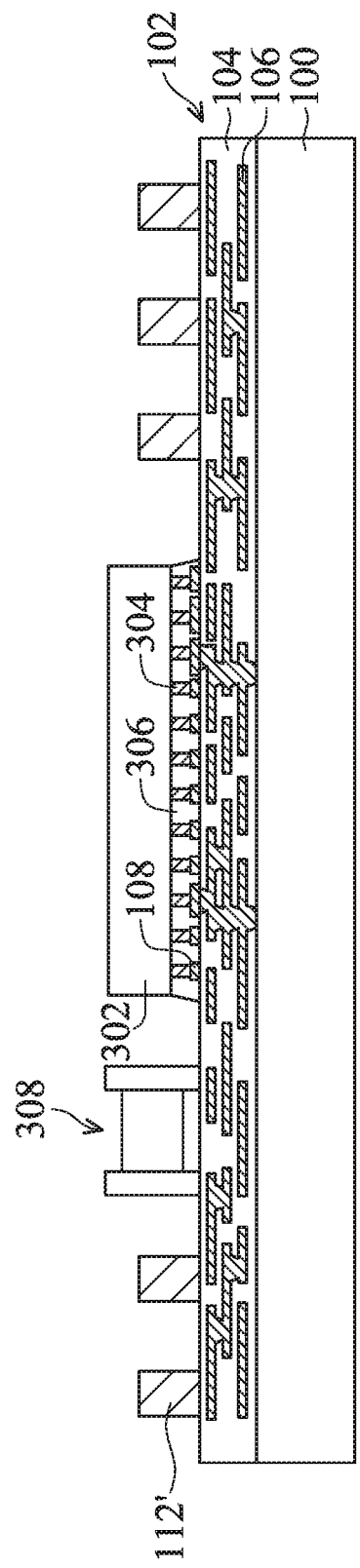

As shown in FIG. 3B, a semiconductor die 302 is stacked over the redistribution structure 102, in accordance with some embodiments. The semiconductor die 302 may include application processors, power management integrated circuits, memory devices, one or more other suitable circuits, or a combination thereof. In some embodiments, the semiconductor die 302 is bonded onto the conductive elements 108 through conductive features 304. The conductive features 304 may include conductive pillars, solder bumps, one or more other suitable bonding structures, or a combination thereof. In some embodiments, an underfill material 306 is formed to surround and protect the conductive features 304.

In some embodiments, one or more device elements 308 are disposed over the redistribution structure 102, as shown in FIG. 3B. The device elements 308 may be bonded onto some of the conductive features 106 of the redistribution structure 102. The device elements 308 may be similar to the device elements 120 illustrated in FIG. 1B.

Figure 3C:
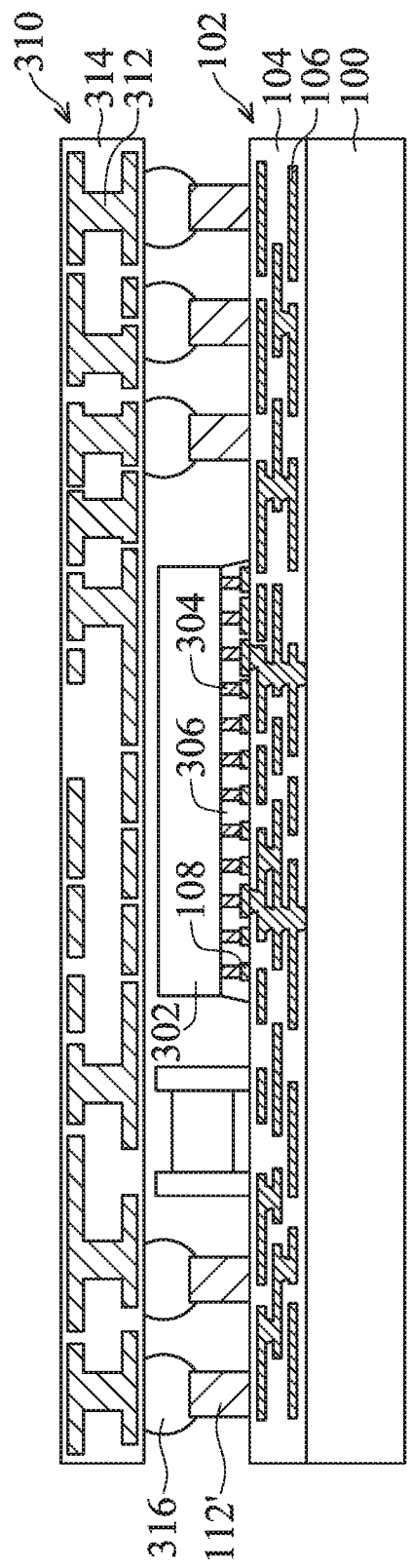

As shown in FIG. 3C, an interposer substrate 310 is stacked over the redistribution structure 102, in accordance with some embodiments. In some embodiments, the interposer substrate 310 extends across edges of the semiconductor die 302. In some embodiments, the interposer substrate 310 is wider than the semiconductor die 302. In some embodiments, the interposer substrate 310 extends across edges of the device element 308. In some embodiments, the interposer substrate 310 extends across edges of the conductive pillars 112'.

In some embodiments, the interposer substrate 310 is bonded to the conductive pillars 112' through conductive structures 316, as shown in FIG. 3C. The conductive structures 316 may include solder bumps, conductive pillars, other suitable conductive elements, or a combination thereof. In some embodiments, the interposer substrate 310 is separated from the semiconductor die 302 by a gap, as shown in FIG. 3C.

In some embodiments, the interposer substrate 310 includes a board 314 and conductive elements 312. The material of the board 314 may be the same as or similar to that of the board 124 shown in FIG. 1C. The material of the conductive elements 312 may be the same as or similar to that of the conductive elements 126.

In some embodiments, the interposer substrate 310 and the carrier substrate 100 are pressed against each other at an elevated temperature. As a result, the interposer substrate 310 is bonded to the redistribution structure 102 through the conductive structures 316. In some embodiments, a thermal compression process is used to achieve the bonding process mentioned above.

Figure 3D:
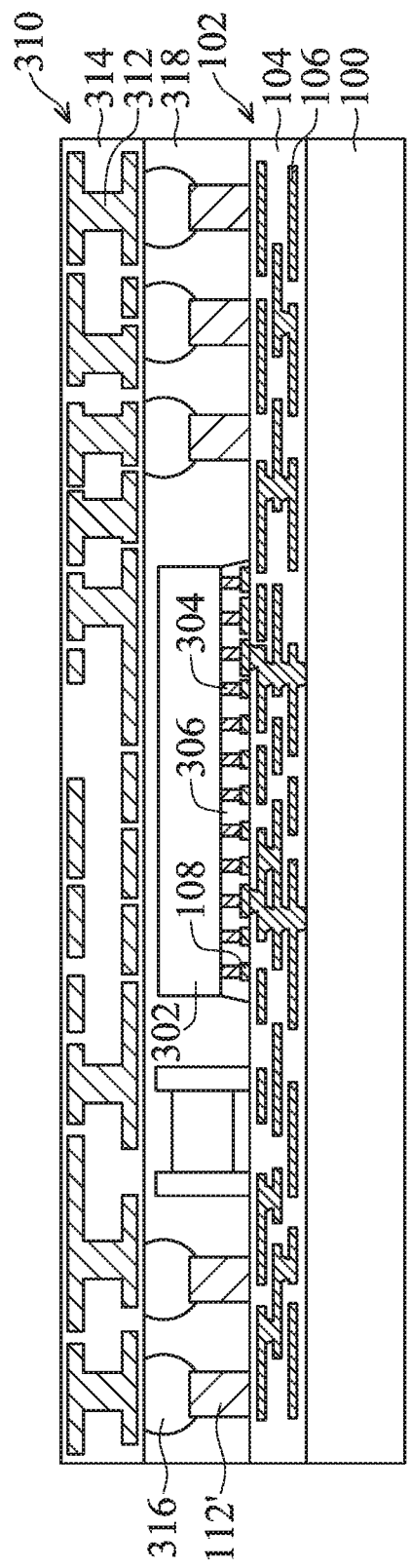

As shown in FIG. 3D, a protective layer 318 is formed to surround and protect the semiconductor die 302, in accordance with some embodiments. In some embodiments, the protective layer 318 is between the interposer substrate 310 and the redistribution structure 102. In some embodiments, the protective layer 318 further surrounds and protects the device elements 308 mounted on the redistribution structure 102. In some embodiments, the protective layer 318 surrounds and protects the conductive pillars 112' and the conductive structures 316. In some embodiments, a portion of the protective layer 318 is between the semiconductor die 302 and the interposer substrate 310, as shown in FIG. 3D. The material and formation method of the protective layer 318 may be the same as or similar to those of the protective layer 144 illustrated in FIG. 1F.

Figure 3E:
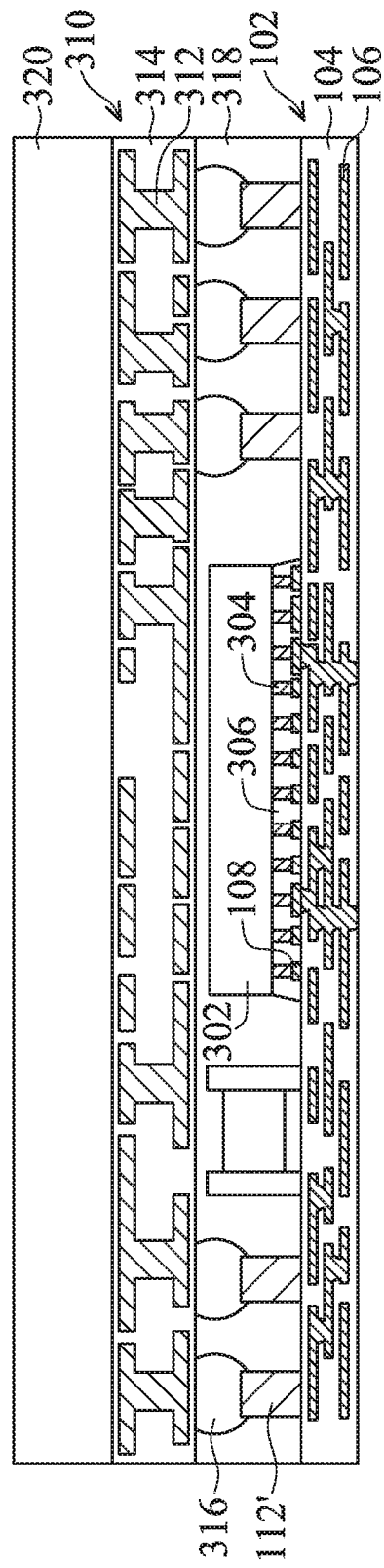

As shown in FIG. 3E, a carrier substrate 320 is bonded to the interposer substrate 310, in accordance with some embodiments. Afterwards, the carrier substrate 100 is removed to expose a surface of the redistribution structure 102, as shown in FIG. 3E.

Figure 3F:
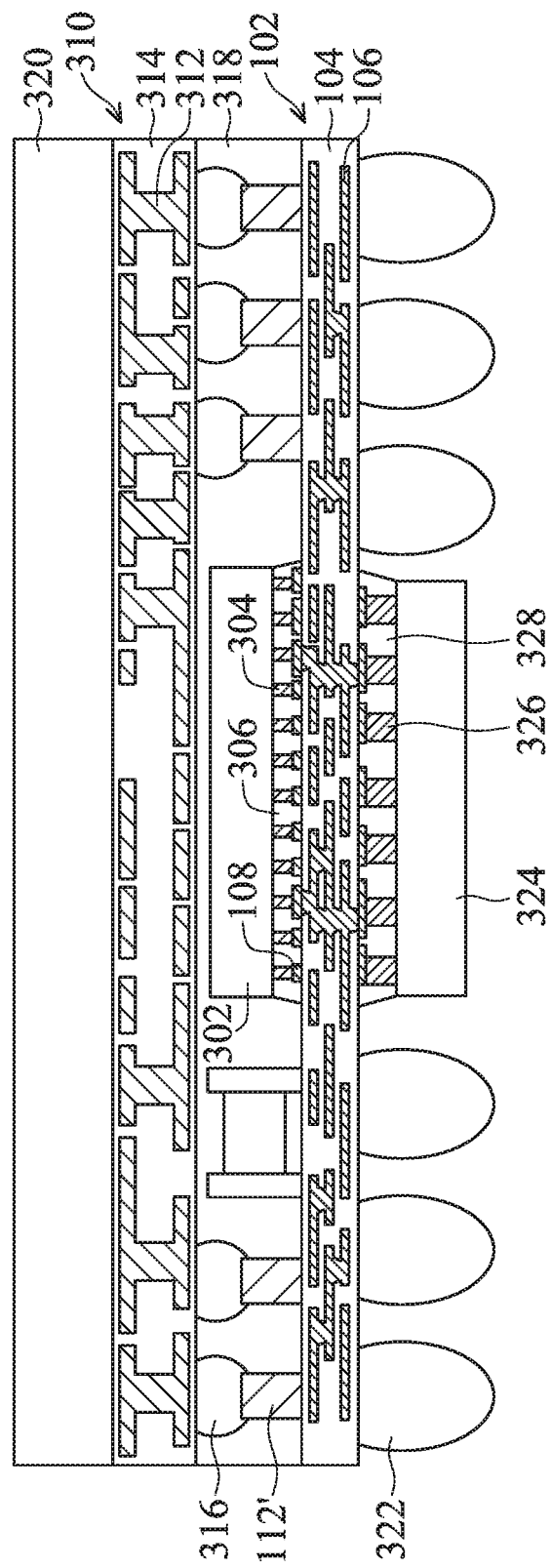

As shown in FIG. 3F, conductive bumps 322 are formed over the surface of the redistribution structure 102 that is originally covered by the carrier substrate 100, in accordance with some embodiments. Each of the conductive bumps 322 may be electrically connected to one of the conductive features 106 of the redistribution structure 102. The material and formation method of the conductive bumps 322 may be the same as or similar to those of the conductive bumps 146 illustrated in FIG. 1G.

As shown in FIG. 3F, a semiconductor die 324 is then stacked over the surface of the redistribution structure 102 that is originally covered by the carrier substrate 100, in accordance with some embodiments. The semiconductor die 324 may include application processors, power management integrated circuits, memory devices, one or more other suitable circuits, or a combination thereof. In some embodiments, the semiconductor die 324 is bonded onto the redistribution structure 102 through conductive features 326. The conductive features 326 may include conductive pillars, solder bumps, one or more other suitable bonding structures, or a combination thereof. In some embodiments, an underfill material 328 is formed to surround and protect the conductive features 326.

In some other embodiments, one or more other surface mounted devices are formed over the surface of the redistribution structure 102 that is originally covered by the carrier substrate 100. The surface mounted devices may include passive elements and/or memory devices.

Figure 3G:
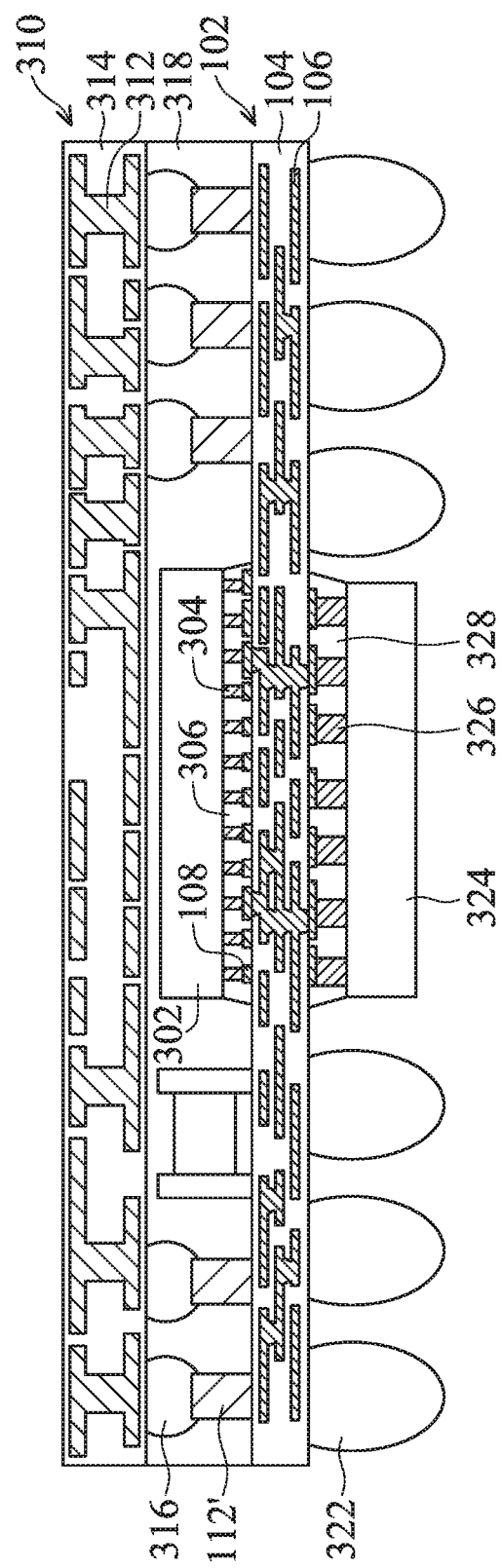

As shown in FIG. 3G, the carrier substrate 320 is removed to expose the interposer substrate 310, in accordance with some embodiments. In some embodiments, before the removal of the carrier substrate 320, the structure shown in FIG. 3F is attached onto a tape carrier.

Figure 3H:
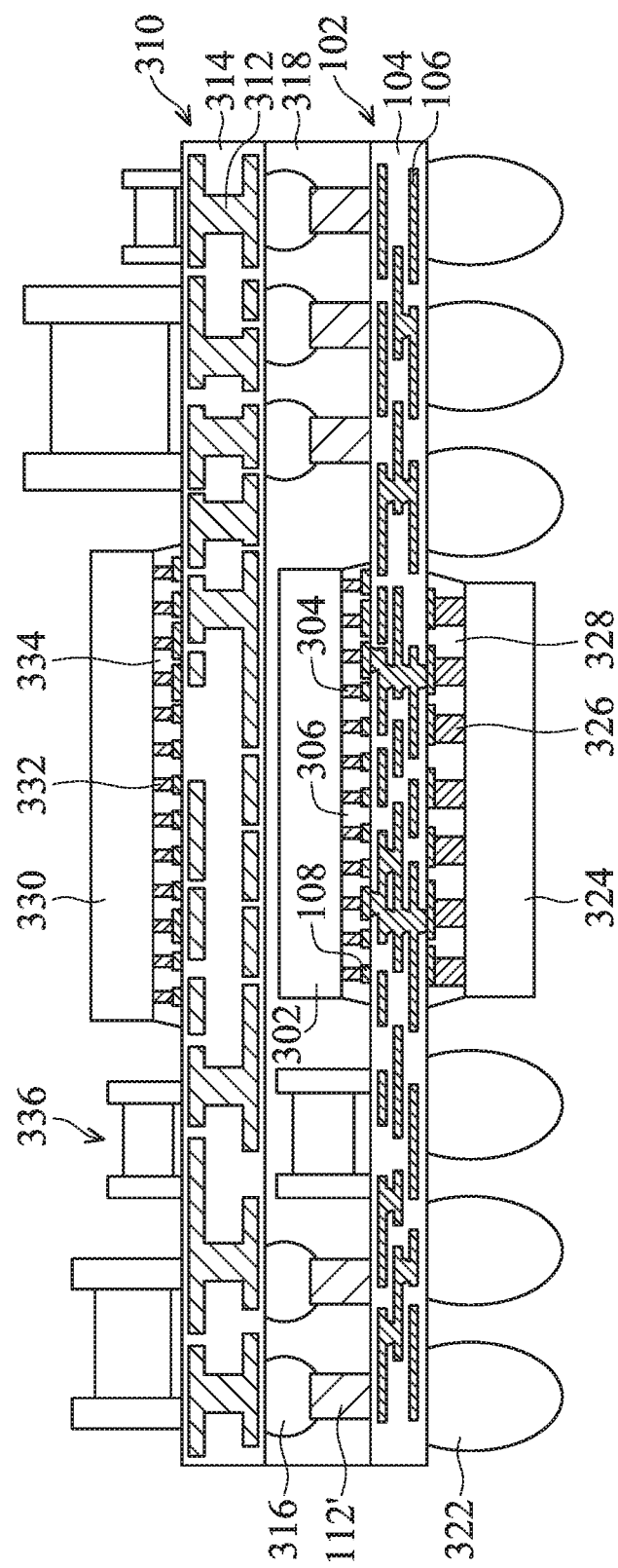

As shown in FIG. 3H, a semiconductor die 330 and device elements 336 are disposed over the interposer substrate 310, in accordance with some embodiments. The semiconductor die 330 may include application processors, power management integrated circuits, memory devices, one or more other suitable circuits, or a combination thereof. In some embodiments, the semiconductor die 330 is bonded onto the interposer substrate 310 through conductive features 332. The conductive features 332 may include conductive pillars, solder bumps, one or more other suitable bonding structures, or a combination thereof. In some embodiments, an underfill material 334 is formed to surround and protect the conductive features 332. The device elements 336 may be bonded and electrically connected to some of the conductive elements 312 of the interposer substrate 310. The device elements 336 may include passive elements and/or memory devices.

In some embodiments, a singulation process is then carried out. As a result, multiple separate package structures are formed. Afterwards, the package structures are removed from the tape carrier. In FIG. 3H, one of the package structures is shown.

Many variations and/or modifications can be made to embodiments of the disclosure. FIGS. 4A-4F are cross-sectional views of various stages of a process for forming a package structure, in accordance with some embodiments.

Figure 4A:
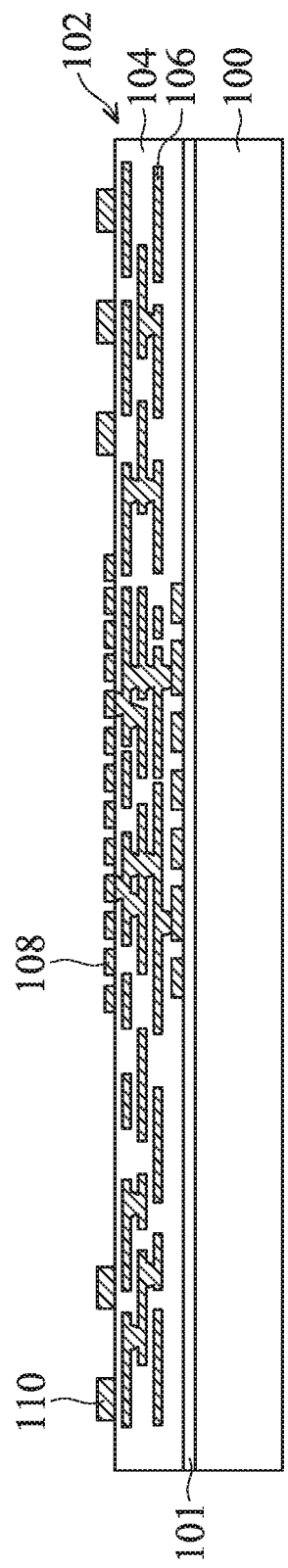
FIGS. 4A-4F are cross-sectional views of various stages of a process for forming a package structure, in accordance with some embodiments.

As shown in FIG. 4A, similar to the embodiments illustrated in FIG. 1A, the redistribution structure 102 is formed over the carrier substrate 100, in accordance with some embodiments. In some embodiments, a release film 101 is formed over the carrier substrate 100 before the formation of the redistribution structure 102. The release film 101 is a temporary bonding material, which facilitate a subsequent separating operation between the carrier substrate 100 and the redistribution structure 102. The release film 101 may also be used in the embodiments illustrated in FIGS. 1A-1G, 2, and 3A-3G.

Figure 4B:
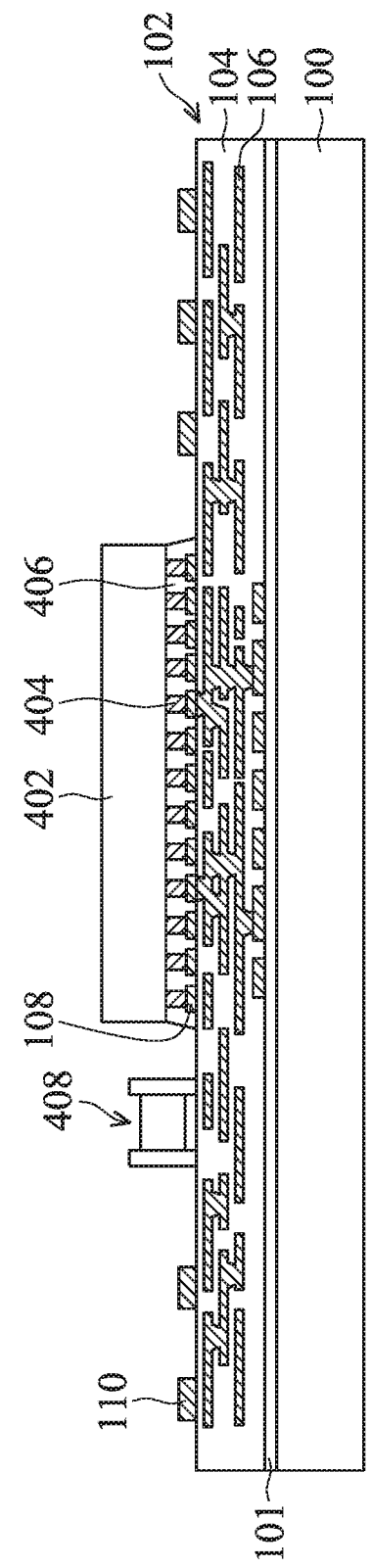

As shown in FIG. 4B, a semiconductor die 402 is stacked over the redistribution structure 102, in accordance with some embodiments. The semiconductor die 402 may include application processors, power management integrated circuits, memory devices, one or more other suitable circuits, or a combination thereof. In some embodiments, the semiconductor die 402 is bonded onto the conductive elements 108 through conductive features 404. The conductive features 404 may include conductive pillars, solder bumps, one or more other suitable bonding structures, or a combination thereof. In some embodiments, an underfill material 406 is formed to surround and protect the conductive features 404.

In some embodiments, one or more device elements 408 are disposed over the redistribution structure 102, as shown in FIG. 4B. The device elements 408 may be bonded onto some of the conductive features 106 of the redistribution structure 102. The device elements 408 may include passive elements and/or memory devices.

Figure 4C:
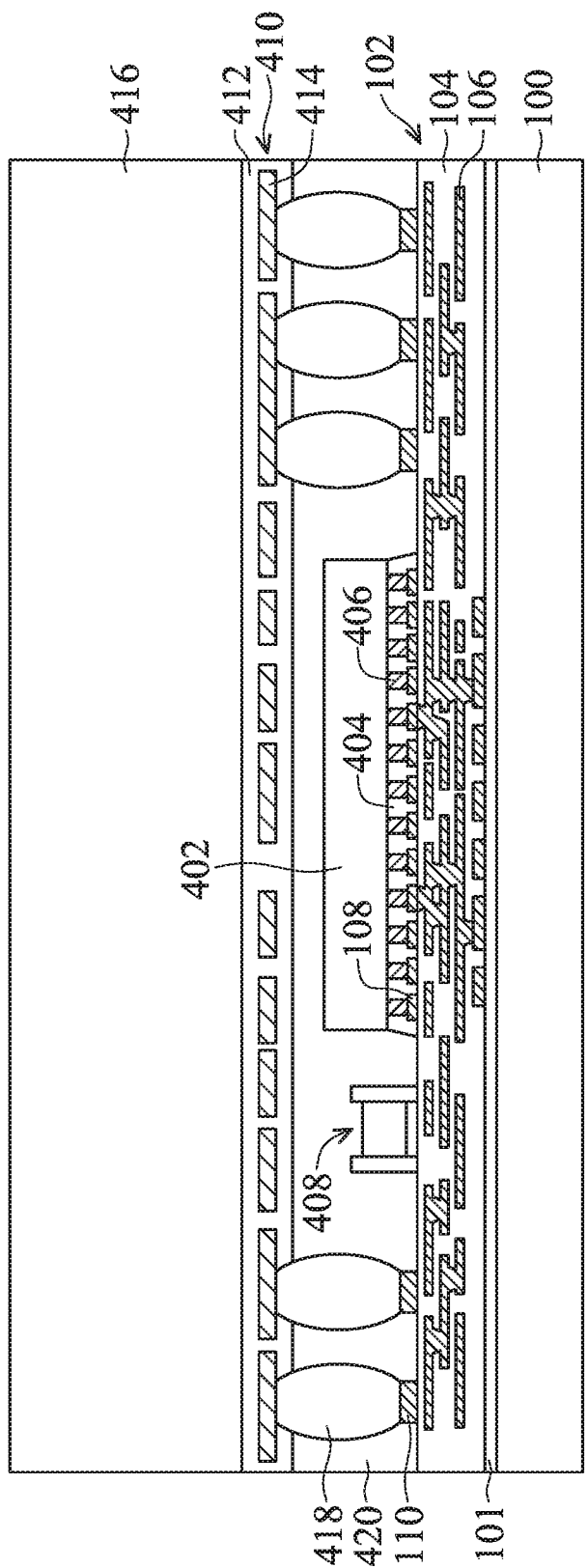

As shown in FIG. 4C, a module 416 carried by an interconnection structure 410 is stacked over the redistribution structure 102, in accordance with some embodiments. In some embodiments, the module 416 extends across edges of the semiconductor die 402.

In some embodiments, the module 416 is bonded to the conductive elements 110 of the redistribution structure 102 through conductive structures 418. The conductive structures 418 may include solder bumps, conductive pillars, other suitable conductive elements, or a combination thereof. In some embodiments, the interconnection structure 410 is separated from the semiconductor die 402 by a gap, as shown in FIG. 4C.

In some embodiments, the module 416 is a package module that has one or more semiconductor dies. For example, the package module includes memory dies. In some embodiments, the module 416 is a semiconductor die. For example, the semiconductor die includes memory devices.

In some embodiments, the interconnection structure 410 is an interposer substrate that carries the module 416. In these cases, the interconnection structure 410 has a structure that is similar to that of the interposer substrate 122 shown in FIG. 1C. In some embodiments, the interconnection structure 410 includes a board 412 and conductive elements 414. The material of the board 412 may be the same as or similar to that of the board 124 of the interposer substrate 122. The material of the conductive elements 414 may be the same as or similar to that of the conductive elements 126 of the interposer substrate 122.

However, embodiments of the disclosure are not limited thereto. Many variations and/or modifications can be made to embodiments of the disclosure. In some other embodiments, the interconnection structure 410 has a structure that is similar to that of the redistribution structure 102.

As shown in FIG. 4C, a protective layer 420 is formed to surround and protect the semiconductor die 402, in accordance with some embodiments. In some embodiments, the protective layer 420 also surrounds and protects the device elements 408 mounted on the redistribution structure 102. In some embodiments, the protective layer 420 further surrounds and protects the conductive structures 418. In some embodiments, a portion of the protective layer 420 is between the interconnection structure 410 and the redistribution structure 102, as shown in FIG. 4C. The material and formation method of the protective layer 420 may be the same as or similar to those of the protective layer 144 illustrated in FIG. 1F.

Figure 4D:
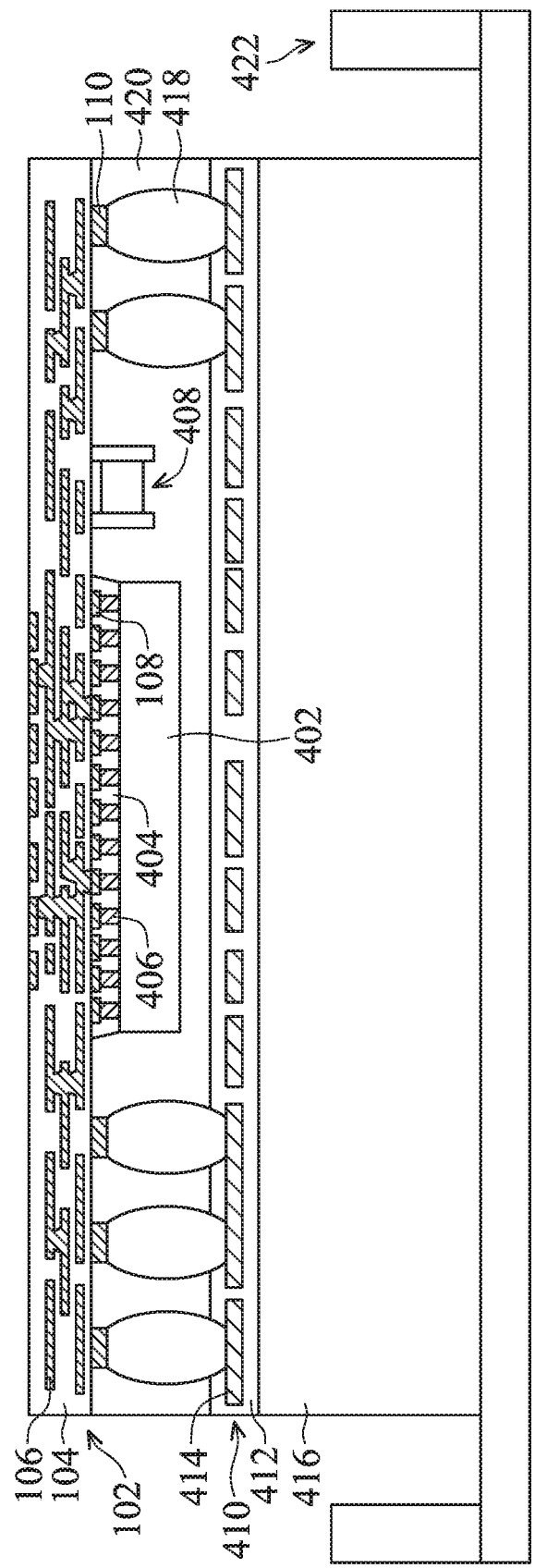

As shown in FIG. 4D, the structure shown in FIG. 4C is turned upside down and attached onto a tape carrier 422, in accordance with some embodiments. Afterwards, the carrier substrate 100 and the release film 101 are removed to expose a surface of the redistribution structure 102.

Figure 4E:
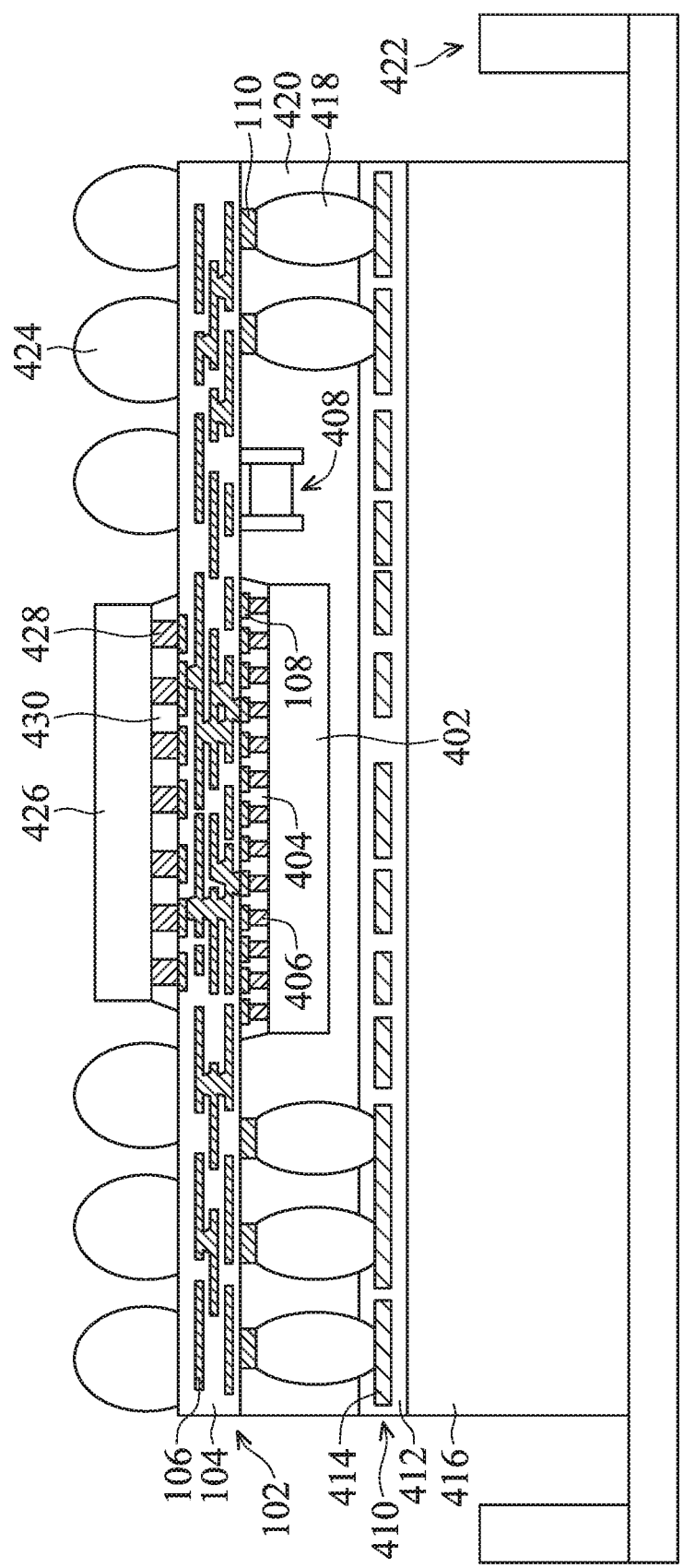

As shown in FIG. 4E, conductive bumps 424 are formed over the surface of the redistribution structure 102 that is originally covered by the carrier substrate 100, in accordance with some embodiments. Each of the conductive bumps 424 may be electrically connected to one of the conductive features 106 of the redistribution structure 102. The material and formation method of the conductive bumps 424 may be the same as or similar to those of the conductive bumps 146 illustrated in FIG. 1G.

As shown in FIG. 4E, a semiconductor die 426 is then stacked over the surface of the redistribution structure 102 that is originally covered by the carrier substrate 100, in accordance with some embodiments. The semiconductor die 426 may include application processors, power management integrated circuits, memory devices, one or more other suitable circuits, or a combination thereof. In some embodiments, the semiconductor die 426 is bonded onto the redistribution structure 102 through conductive features 428. The conductive features 428 may include conductive pillars, solder bumps, one or more other suitable bonding structures, or a combination thereof. In some embodiments, an underfill material 430 is formed to surround and protect the conductive features 428.

In some other embodiments, one or more other surface mounted devices are formed over the surface of the redistribution structure 102 that is originally covered by the carrier substrate 100. The surface mounted devices may include passive elements and/or memory devices.

Figure 4F:
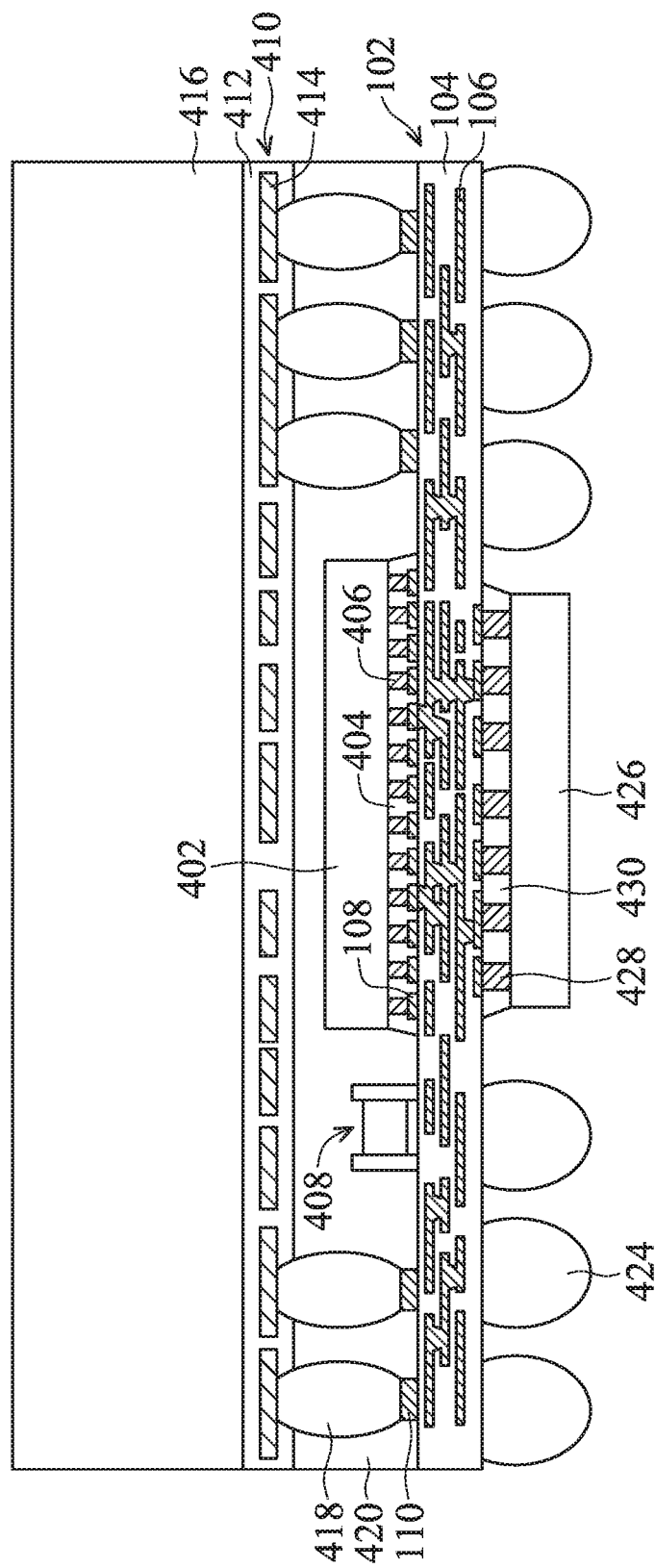

In some embodiments, a singulation process is then carried out. As a result, multiple separate package structures are formed. The package structures are then removed from the tape carrier 422. In FIG. 4F, one of the package structures is shown.

Many variations and/or modifications can be made to embodiments of the disclosure. FIGS. 5A-5F are cross-sectional views of various stages of a process for forming a package structure, in accordance with some embodiments.

Figure 5A:
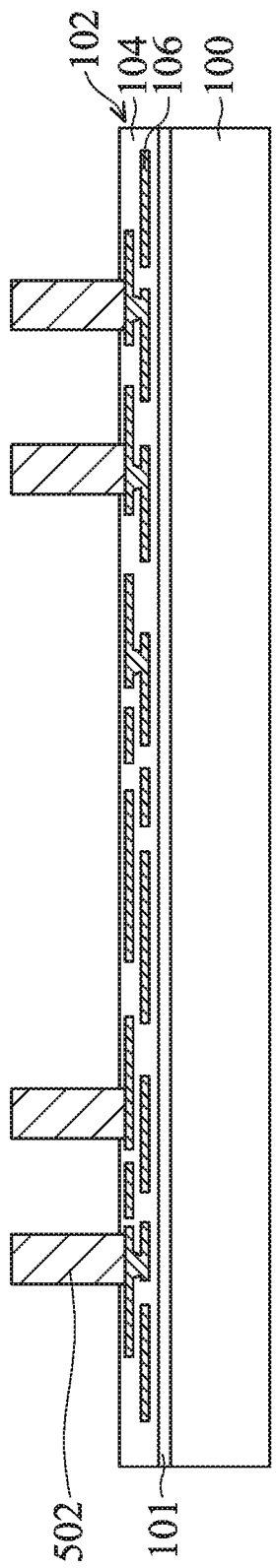
FIGS. 5A-5F are cross-sectional views of various stages of a process for forming a package structure, in accordance with some embodiments.

As shown in FIG. 5A, a structure similar to that shown in FIG. 4A is provided or received. Afterwards, conductive pillars 502 are formed over the redistribution structure 102, in accordance with some embodiments.

Figure 5B:
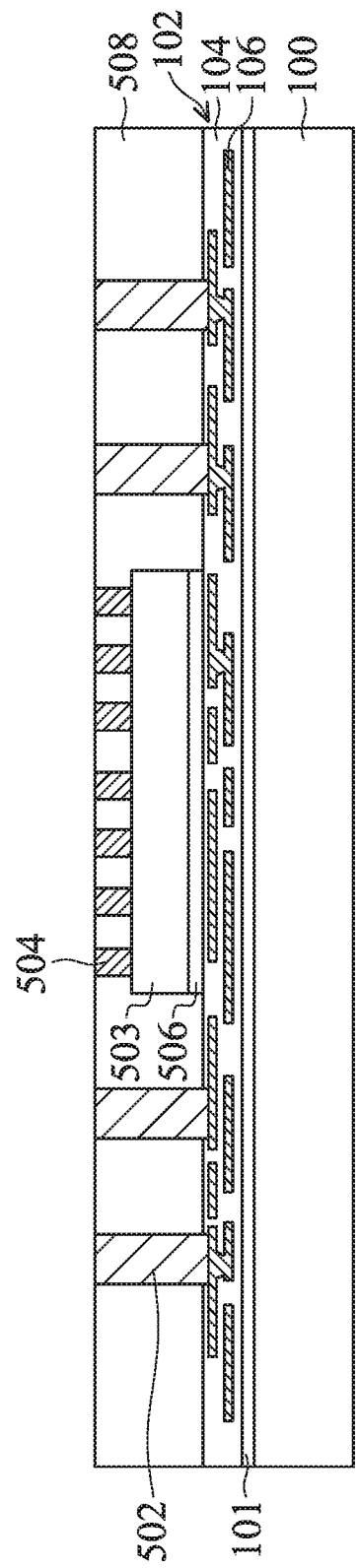

As shown in FIG. 5B, a semiconductor die 503 is attached to the redistribution structure 102 using an adhesive element 506, in accordance with some embodiments. For example, the adhesive element 506 is a die attachment tape. Conductive pillars 504 of the semiconductor die 503 face upwards, as shown in FIG. 5B. The semiconductor die 503 may include application processors, power management integrated circuits, memory devices, one or more other suitable circuits, or a combination thereof.

Afterwards, a protective layer 508 is formed to surround and protect the semiconductor die 503 and the conductive pillars 502, as shown in FIG. 5B in accordance with some embodiments. The material and formation method of the protective layer 508 may be the same as or similar to those of the protective layer 144 illustrated in FIG. 1F. In some embodiments, a planarization process is applied on the protective layer 508 to partially remove the protective layer 508. As a result, the top surfaces of the conductive pillars 502 and the conductive pillars 504 are exposed, as shown in FIG. 5B. In some embodiments, the top surface of the protective layer 508 is substantially level with the top surfaces of the conductive pillars 502 and 504. The planarization process may include a grinding process, a chemical mechanical polishing (CMP) process, an etching process, a dry polishing process, one or more other applicable processes, or a combination thereof.

Figure 5C:
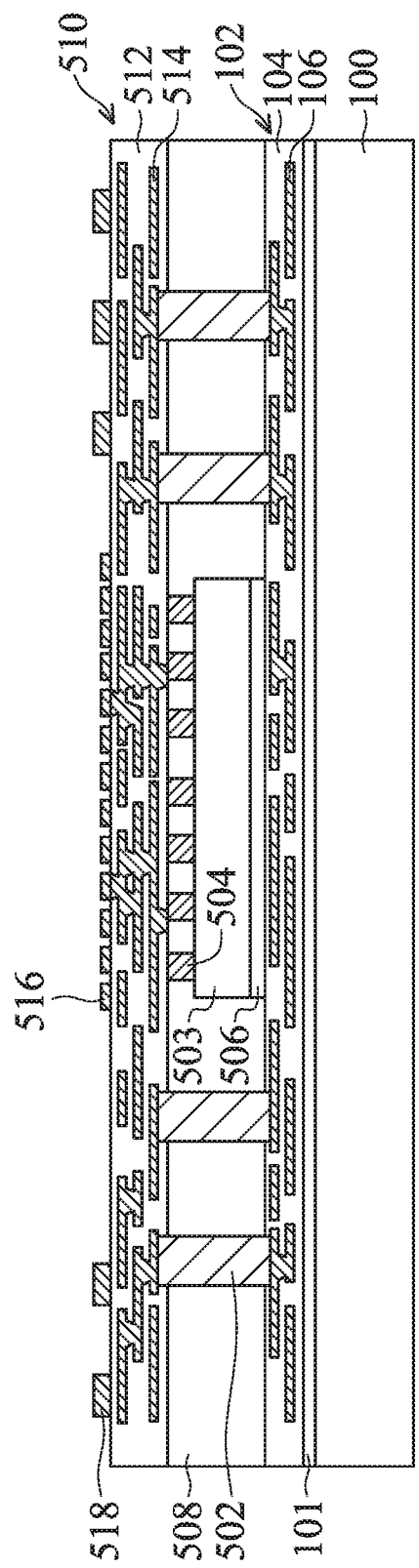

As shown in FIG. 5C, a redistribution structure 510 is formed over the protective layer 508, in accordance with some embodiments. Similar to the redistribution structure 102 shown in FIG. 1A, the redistribution structure 510 includes insulating layers 512, conductive features 514, and conductive elements 516 and 518. The material and formation method of the redistribution structure 510 may be the same as or similar to those of the redistribution structure 102 illustrated in FIG. 1A.

Figure 5D:
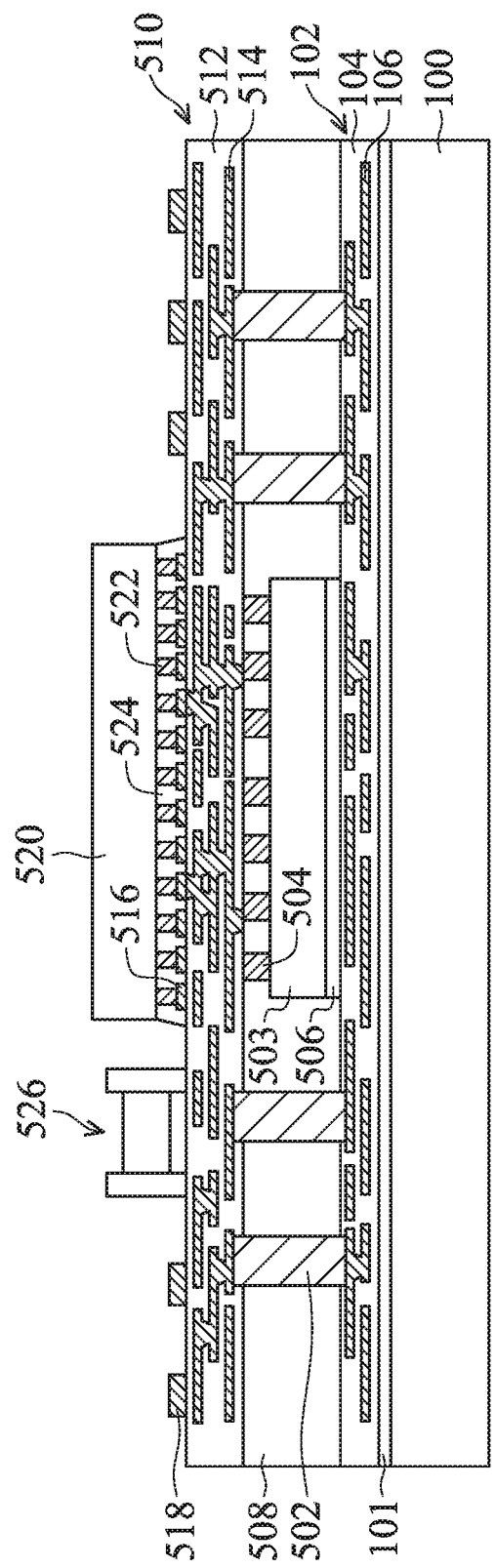

As shown in FIG. 5D, a semiconductor die 520 is stacked over the redistribution structure 510, in accordance with some embodiments. In some embodiments, the semiconductor die 520 is bonded onto the conductive elements 516 through conductive features 522. In some embodiments, an underfill material 524 is formed to surround and protect the conductive features 522. In some embodiments, one or more device elements 526 are disposed over the redistribution structure 510, as shown in FIG. 5B. The device elements 526 may be bonded onto some of the conductive features 514 of the redistribution structure 510. The device elements 526 may include passive elements and/or memory devices.

Figure 5E:
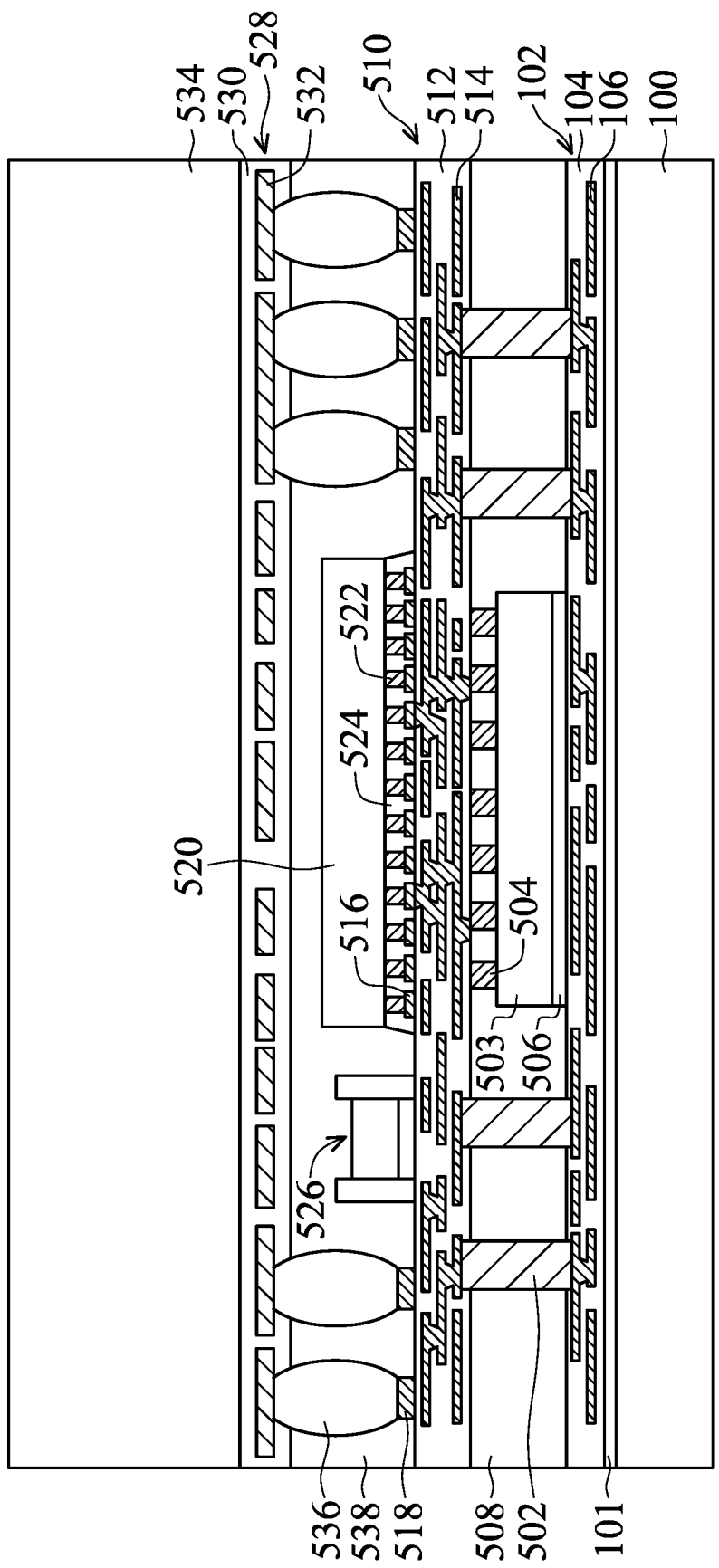

As shown in FIG. 5E, a module 534 carried by an interconnection structure 528 is stacked over the redistribution structure 510, in accordance with some embodiments. In some embodiments, the module 534 extends across edges of the semiconductor die 520.

In some embodiments, the module 534 is bonded to the conductive elements 518 of the redistribution structure 510 through conductive structures 536. The conductive structures 536 may include solder bumps, conductive pillars, other suitable conductive elements, or a combination thereof. In some embodiments, the interconnection structure 528 is separated from the semiconductor die 520 by a gap, as shown in FIG. 5E.

In some embodiments, the module 534 is a package module that has one or more semiconductor dies. For example, the package module includes memory dies. In some embodiments, the module 534 is a semiconductor die. For example, the semiconductor die includes memory devices.

In some embodiments, the interconnection structure 528 is an interposer substrate that carries the module 534. In these cases, the interconnection structure 528 has a structure that is similar to that of the interposer substrate 122 shown in FIG. 1C. In some embodiments, the interconnection structure 528 includes a board 530 and conductive elements 532. The material of the board 530 may be the same as or similar to that of the board 124 of the interposer substrate 122. The material of the conductive elements 532 may be the same as or similar to that of the conductive elements 126 of the interposer substrate 122.

However, embodiments of the disclosure are not limited thereto. Many variations and/or modifications can be made to embodiments of the disclosure. In some other embodiments, the interconnection structure 528 has a structure that is similar to that of the redistribution structure 510.

Afterwards, a protective layer 538 is formed to surround and protect the semiconductor die 520, as shown in FIG. 5E in accordance with some embodiments. In some embodiments, the protective layer 538 also surrounds and protects the device elements 526 mounted on the redistribution structure 510. In some embodiments, the protective layer 538 further surrounds and protects the conductive structures 536. In some embodiments, a portion of the protective layer 538 is between the interconnection structure 528 and the redistribution structure 510, as shown in FIG. 5E. The material and formation method of the protective layer 538 may be the same as or similar to those of the protective layer 144 illustrated in FIG. 1F.

Figure 5F:
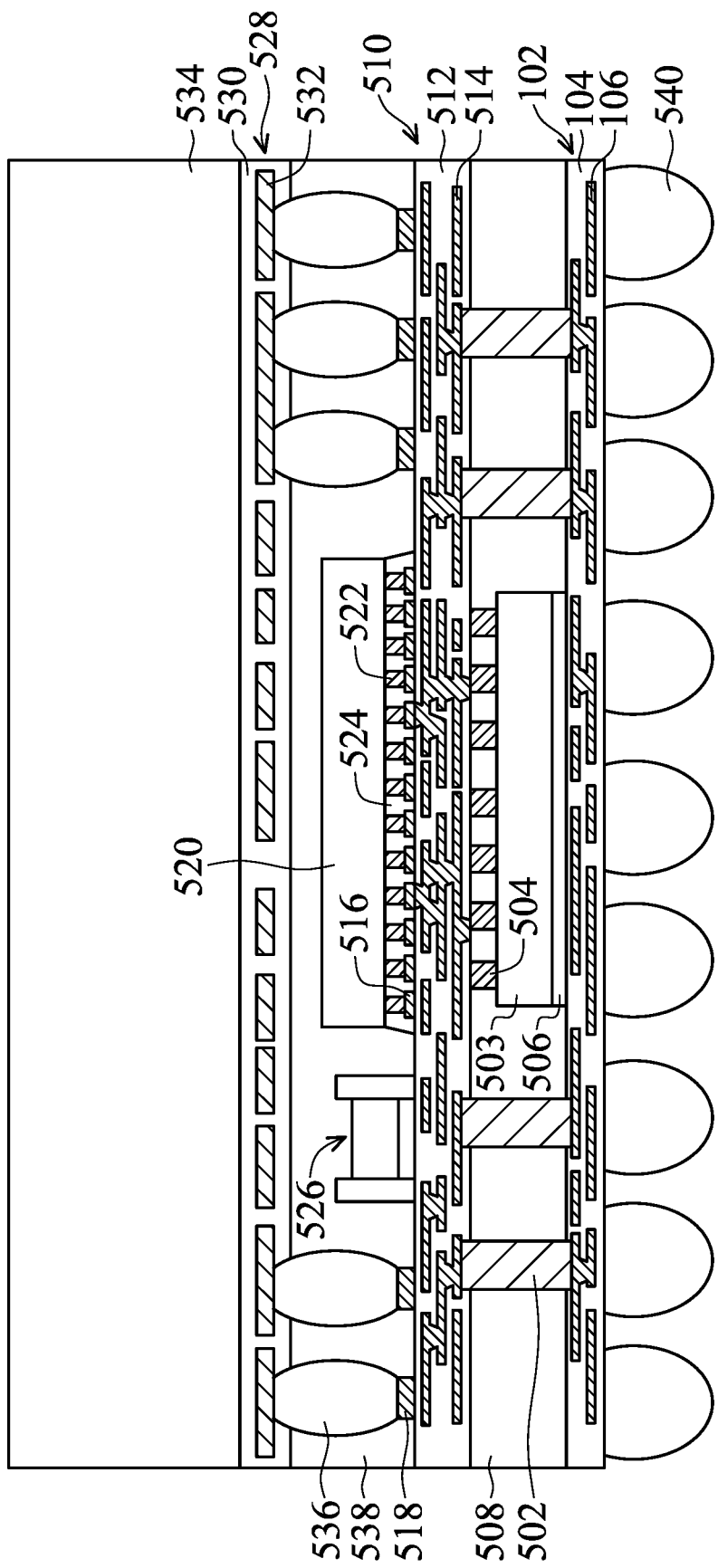

As shown in FIG. 5F, the carrier substrate 100 and the release film 101 are removed to expose a surface of the redistribution structure 102, in accordance with some embodiments. Afterwards, conductive bumps 540 are formed over the surface of the redistribution structure 102 that is originally covered by the carrier substrate 100, as shown in FIG. 5F in accordance with some embodiments. Each of the conductive bumps 540 may be electrically connected to one of the conductive features 106 of the redistribution structure 102. The material and formation method of the conductive bumps 540 may be the same as or similar to those of the conductive bumps 146 illustrated in FIG. 1G.

In some embodiments, a singulation process is then carried out. As a result, multiple separate package structures are formed. In FIG. 5F, one of the package structures is shown.

Figure 6A:
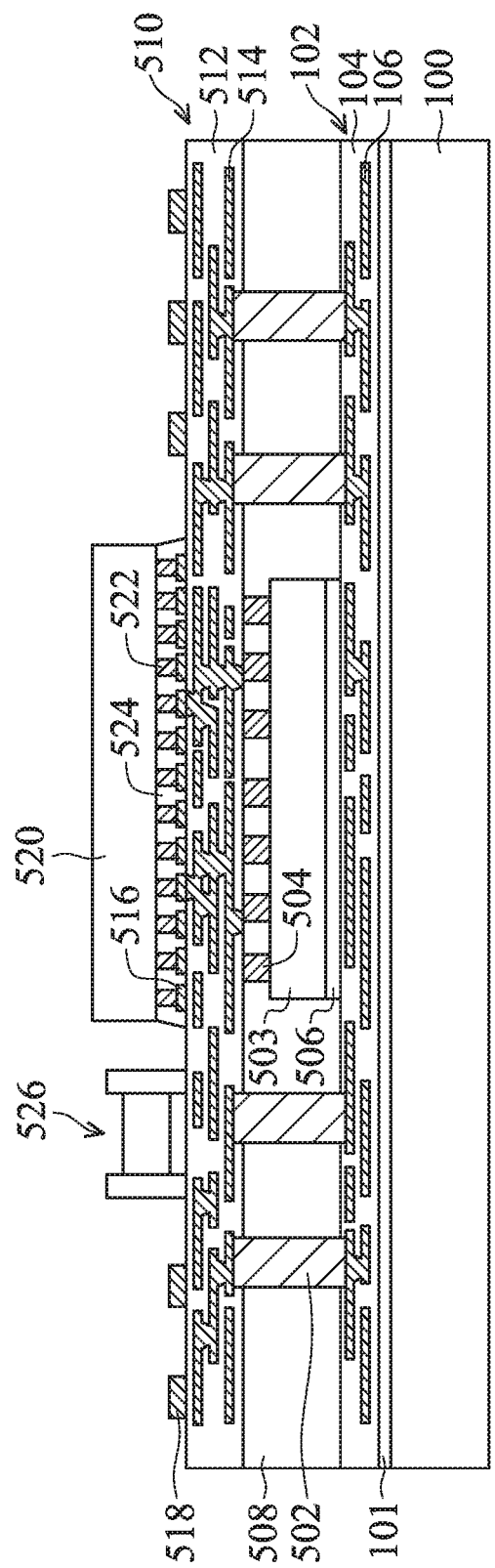
FIGS. 6A-6D are cross-sectional views of various stages of a process for forming a package structure, in accordance with some embodiments.

Many variations and/or modifications can be made to embodiments of the disclosure. FIGS. 6A-6D are cross-sectional views of various stages of a process for forming a package structure, in accordance with some embodiments. As shown in FIG. 6A, a structure that is similar to the structure shown in FIG. 5D is provided or received, in accordance with some embodiments.

Figure 6B:
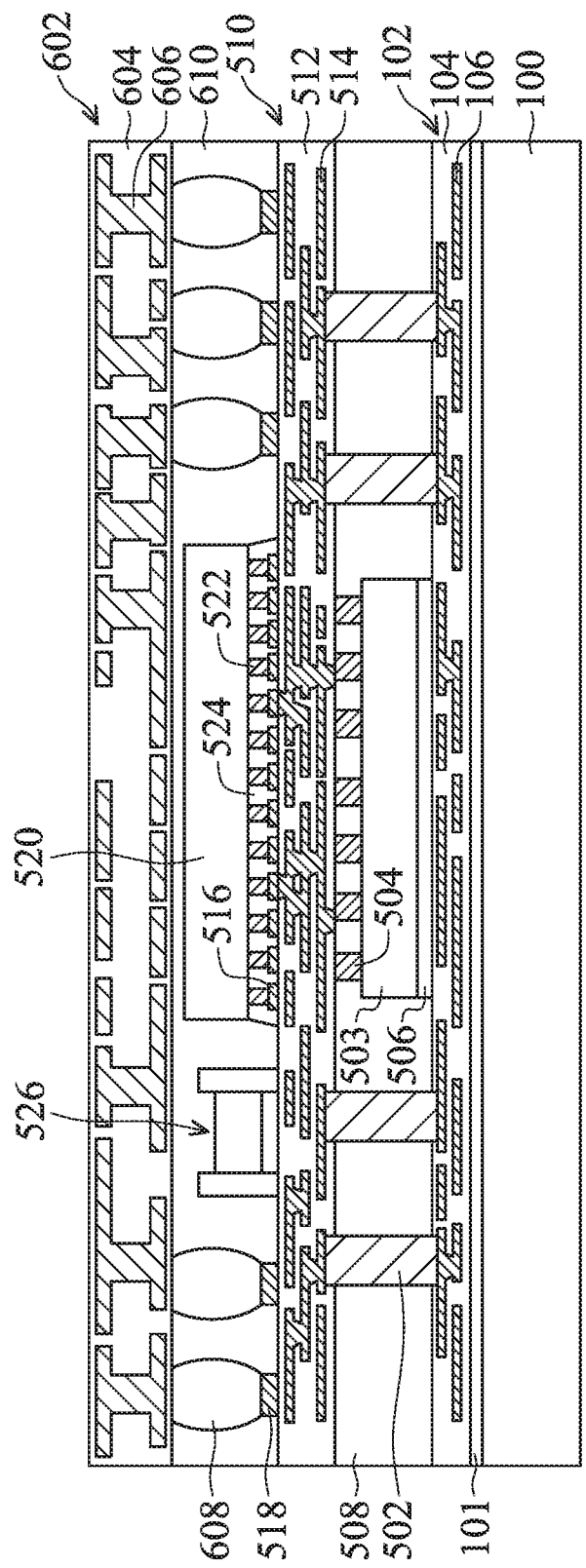

As shown in FIG. 6B, an interposer substrate 602 is stacked over the redistribution structure 510, in accordance with some embodiments. In some embodiments, the interposer substrate 602 extends across edges of the semiconductor die 520. In some embodiments, the interposer substrate 602 is wider than the semiconductor die 520. In some embodiments, the interposer substrate 602 extends across edges of the device element 526.

In some embodiments, the interposer substrate 602 is bonded to the conductive elements 518 through conductive structures 608, as shown in FIG. 6B. The conductive structures 608 may include solder bumps, conductive pillars, other suitable conductive elements, or a combination thereof. In some embodiments, the interposer substrate 602 is separated from the semiconductor die 520 by a gap, as shown in FIG. 6B.

In some embodiments, the interposer substrate 602 includes a board 604 and conductive elements 606. The material of the board 604 may be the same as or similar to that of the board 124 shown in FIG. 1C. The material of the conductive elements 606 may be the same as or similar to that of the conductive elements 126.

In some embodiments, the interposer substrate 602 and the carrier substrate 100 are pressed against each other at an elevated temperature. As a result, the interposer substrate 602 is bonded to the redistribution structure 510 through the conductive structures 608. In some embodiments, a thermal compression process is used to achieve the bonding process mentioned above.

As shown in FIG. 6B, a protective layer 610 is formed to surround and protect the semiconductor die 520, in accordance with some embodiments. In some embodiments, the protective layer 610 is between the interposer substrate 602 and the redistribution structure 510. In some embodiments, the protective layer 610 further surrounds and protects the device elements 526 mounted on the redistribution structure 510. In some embodiments, the protective layer 610 surrounds and protects the conductive elements 518 and the conductive structures 608. In some embodiments, a portion of the protective layer 610 is between the semiconductor die 520 and the interposer substrate 602, as shown in FIG. 6B. The material and formation method of the protective layer 610 may be the same as or similar to those of the protective layer 144 illustrated in FIG. 1F.

Figure 6C:
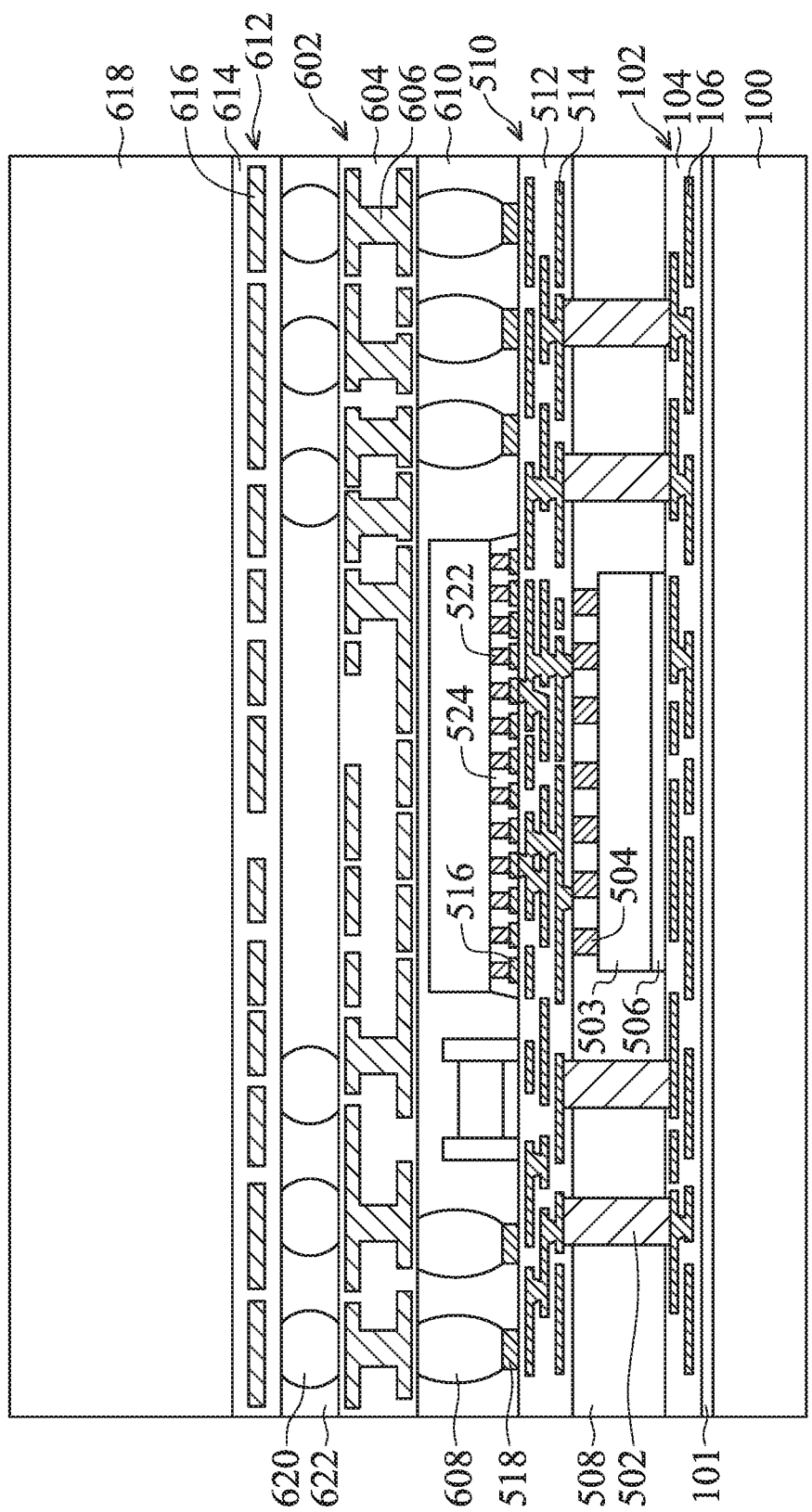

As shown in FIG. 6C, a module 618 carried by an interconnection structure 612 is stacked over the interposer substrate 602, in accordance with some embodiments. In some embodiments, the module 618 is bonded to the conductive elements 606 of the interposer substrate 602 through conductive structures 620. The conductive structures 620 may include solder bumps, conductive pillars, other suitable conductive elements, or a combination thereof. In some embodiments, the interconnection structure 612 is separated from the interposer substrate 602 by a gap, as shown in FIG. 6C. In some embodiments, an underfill material 622 is formed to fill the gap and protect the conductive structures 620.

In some embodiments, the module 618 is a package module that has one or more semiconductor dies. For example, the package module includes memory dies. In some embodiments, the module 618 is a semiconductor die. For example, the semiconductor die includes memory devices.

In some embodiments, the interconnection structure 612 is an interposer substrate that carries the module 618. In these cases, the interconnection structure 612 has a structure that is similar to that of the interposer substrate 122 shown in FIG. 1C. In some embodiments, the interconnection structure 612 includes a board 614 and conductive elements 616. The material of the board 614 may be the same as or similar to that of the board 124 of the interposer substrate 122. The material of the conductive elements 616 may be the same as or similar to that of the conductive elements 126 of the interposer substrate 122.

However, embodiments of the disclosure are not limited thereto. Many variations and/or modifications can be made to embodiments of the disclosure. In some other embodiments, the interconnection structure 612 has a structure that is similar to that of the redistribution structure 102.

Figure 6D:
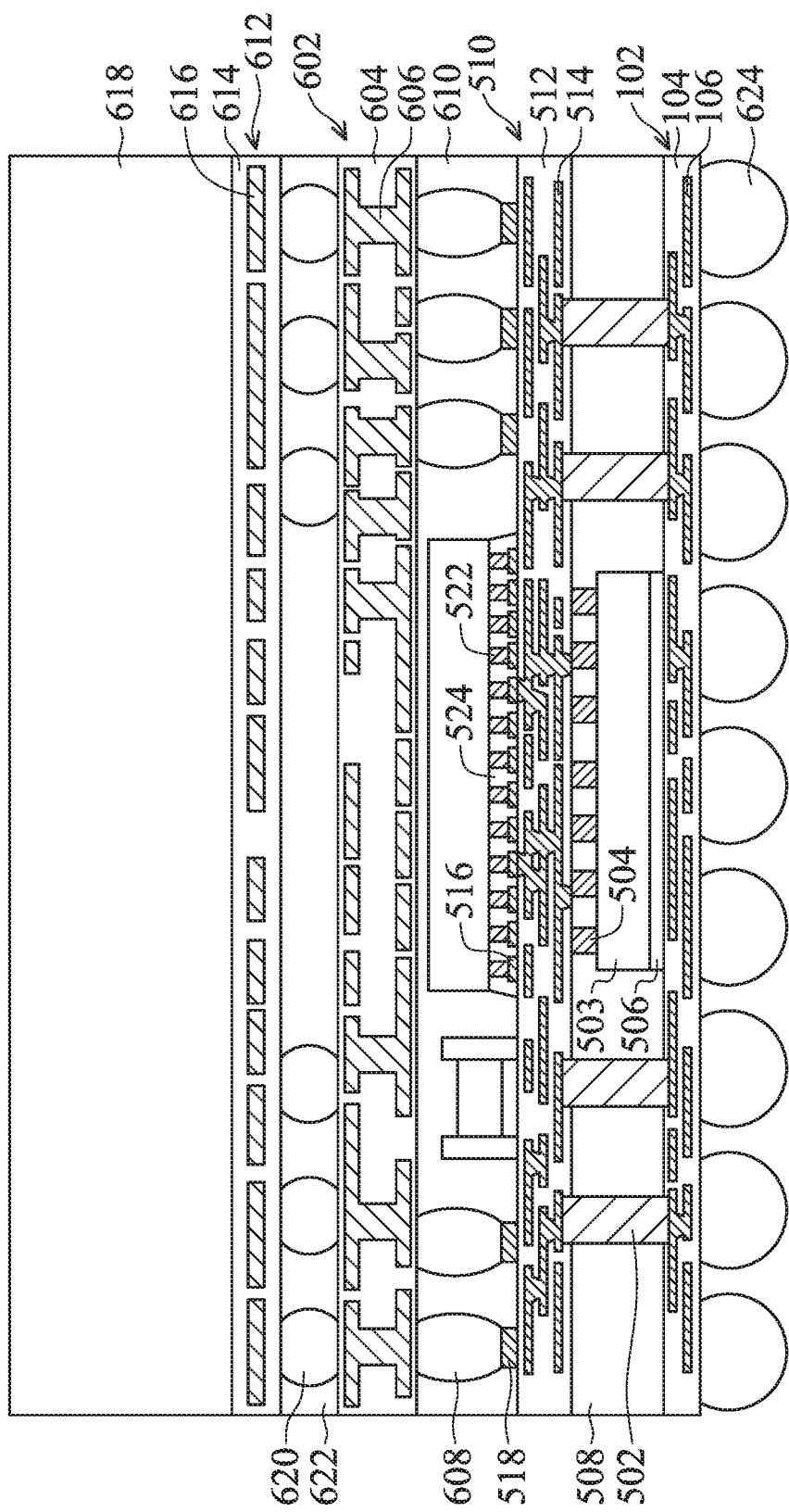

As shown in FIG. 6D, the carrier substrate 100 and the release film 101 are removed to expose a surface of the redistribution structure 102, in accordance with some embodiments. Afterwards, conductive bumps 624 are formed over the surface of the redistribution structure 102 that is originally covered by the carrier substrate 100, as shown in FIG. 6D in accordance with some embodiments. Each of the conductive bumps 624 may be electrically connected to one of the conductive features 106 of the redistribution structure 102. The material and formation method of the conductive bumps 624 may be the same as or similar to those of the conductive bumps 146 illustrated in FIG. 1G.

In some embodiments, a singulation process is then carried out. As a result, multiple separate package structures are formed. In FIG. 6D, one of the package structures is shown.

Many variations and/or modifications can be made to embodiments of the disclosure. FIGS. 7A-7G are cross-sectional views of various stages of a process for forming a package structure, in accordance with some embodiments.

Figure 7A:
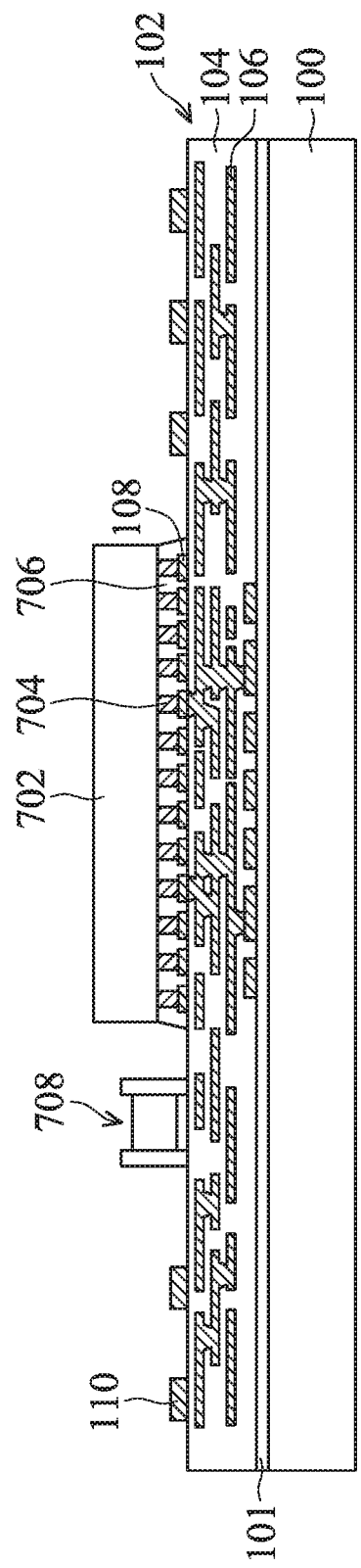
FIGS. 7A-7G are cross-sectional views of various stages of a process for forming a package structure, in accordance with some embodiments.

As shown in FIG. 7A, a structure that is similar to the structure shown in FIG. 4A is provided or received. Afterwards, a semiconductor die 702 and a device element 708 are stacked over the redistribution structure 102, in accordance with some embodiments. In some embodiments, the semiconductor die 702 is bonded onto the conductive elements 108 of the redistribution structure 102 through conductive features 704. In some embodiments, an underfill material 706 is formed to surround and protect the conductive features 704. The device element 708 may include passive devices and/or memory devices.

Figure 7B:
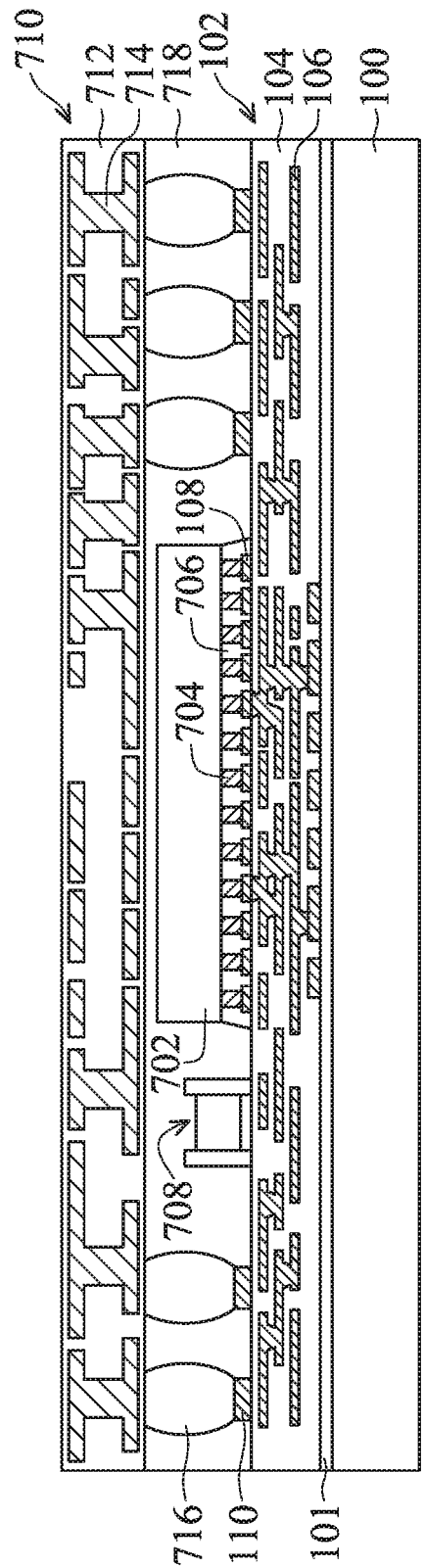

As shown in FIG. 7B, an interposer substrate 710 is stacked over the redistribution structure 102, in accordance with some embodiments. In some embodiments, the interposer substrate 710 extends across edges of the semiconductor die 702. In some embodiments, the interposer substrate 710 is wider than the semiconductor die 702. In some embodiments, the interposer substrate 710 extends across edges of the device element 708.

In some embodiments, the interposer substrate 710 is bonded to the conductive elements 110 through conductive structures 716, as shown in FIG. 7B. The conductive structures 716 may include solder bumps, conductive pillars, other suitable conductive elements, or a combination thereof. In some embodiments, the interposer substrate 710 is separated from the semiconductor die 702 by a gap, as shown in FIG. 7B.

In some embodiments, the interposer substrate 710 includes a board 712 and conductive elements 714. The material of the board 712 may be the same as or similar to that of the board 124 shown in FIG. 1C. The material of the conductive elements 714 may be the same as or similar to that of the conductive elements 126.

In some embodiments, the interposer substrate 710 and the carrier substrate 100 are pressed against each other at an elevated temperature. As a result, the interposer substrate 710 is bonded to the redistribution structure 102 through the conductive structures 716. In some embodiments, a thermal compression process is used to achieve the bonding process mentioned above.

As shown in FIG. 7B, a protective layer 718 is formed to surround and protect the semiconductor die 702, in accordance with some embodiments. In some embodiments, the protective layer 718 is between the interposer substrate 710 and the redistribution structure 102. In some embodiments, the protective layer 718 further surrounds and protects the device elements 708 mounted on the redistribution structure 102. In some embodiments, the protective layer 718 surrounds and protects the conductive structures 716. In some embodiments, a portion of the protective layer 718 is between the semiconductor die 702 and the interposer substrate 710, as shown in FIG. 7B. The material and formation method of the protective layer 718 may be the same as or similar to those of the protective layer 144 illustrated in FIG. 1F.

Figure 7C:
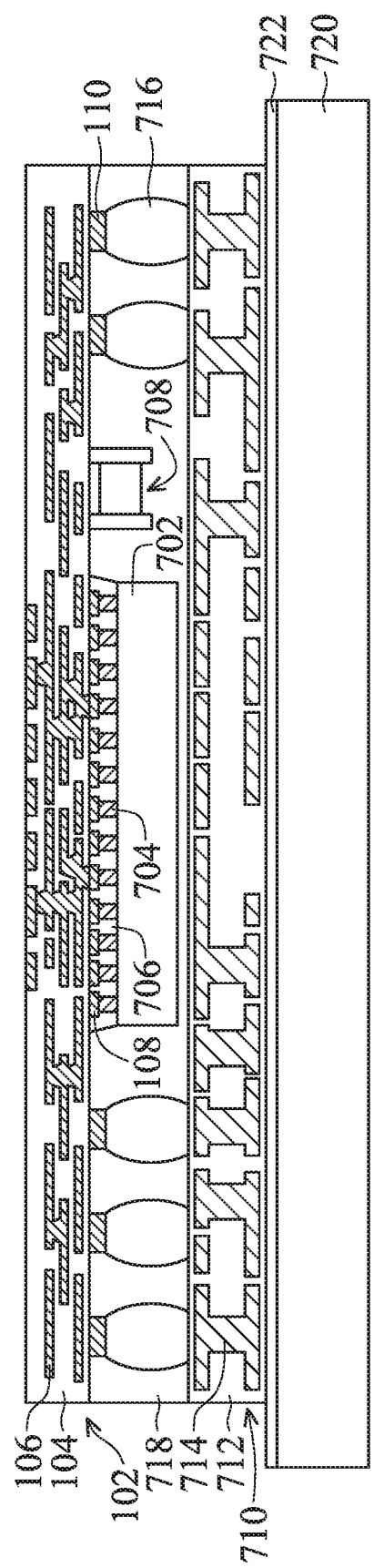

As shown in FIG. 7C, the structure shown in FIG. 7B is turned upside down and attached onto a carrier substrate 720 through a release film 722, in accordance with some embodiments. Afterwards, the carrier substrate 100 and the release film 101 are removed. As a result, a surface of the redistribution structure 102 that is originally covered by the carrier substrate 100 is exposed, as shown in FIG. 7C.

Figure 7D:
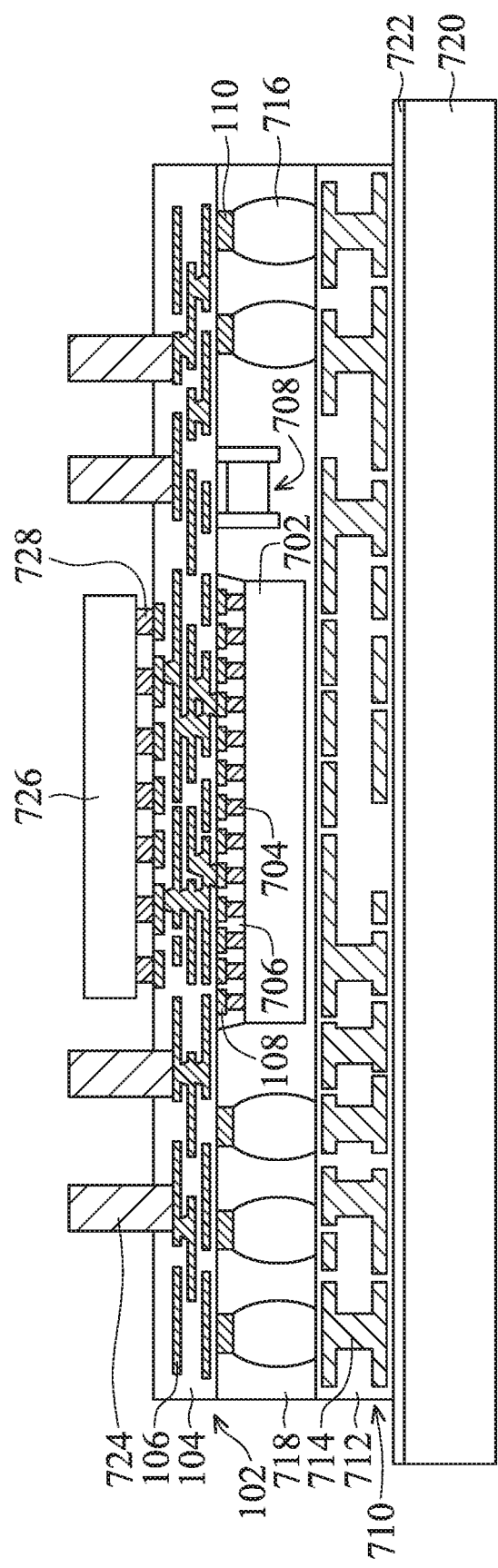

As shown in FIG. 7D, conductive pillars 724 are formed over the redistribution structure 102, in accordance with some embodiments. Each of the conductive pillars 724 is electrically connected to one of the conductive features 106 of the redistribution structure 102. The material and formation method of the conductive pillars 724 may be the same as or similar to those of the conductive pillars 112 illustrated in FIG. 1A. In some embodiments, before the formation of the conductive pillars 724, a patterning process is used to form openings in the redistribution structure 102 to expose some of the conductive features 106.

Afterwards, a semiconductor die 726 is stacked over the redistribution structure 102, as shown in FIG. 7D in accordance with some embodiments. In some embodiments, the semiconductor die 726 is bonded onto the redistribution structure 102 through conductive features 728. Each of the conductive features 728 may be electrically connected to one of the conductive features 106 of the redistribution structure 102. In some embodiments, the conductive pillars 724 has a height that is taller than that of the semiconductor die 726, as shown in FIG. 7D.

Figure 7E:
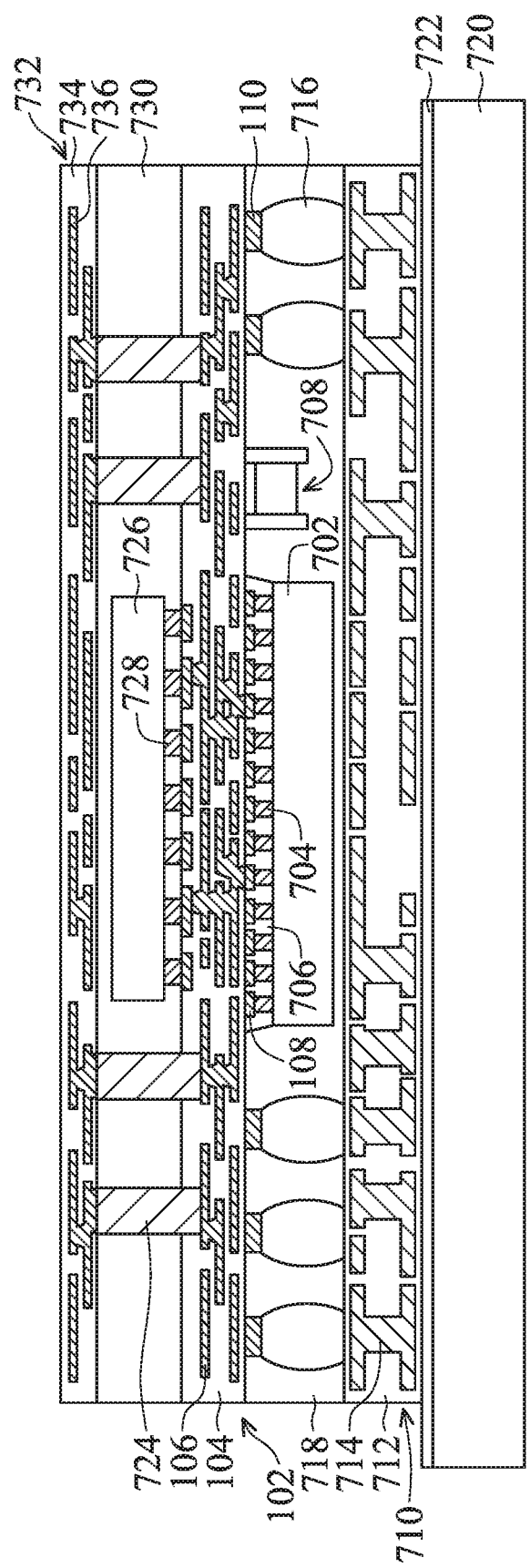

As shown in FIG. 7E, a protective layer 730 is formed to surround and protect the semiconductor die 726 and the conductive pillars 724, in accordance with some embodiments. The material and formation method of the protective layer 730 may be the same as or similar to those of the protective layer 144 illustrated in FIG. 1F. In some embodiments, a planarization process is used to thin the protective layer 730. As a result, the protective layer 730 has a substantially planar top surface, which facilitates subsequent processes. In some embodiments, the top surface of the protective layer 730 is substantially level with the top surfaces of the conductive pillars 724. The planarization process may include a grinding process, a CMP process, an etching process, a dry polishing process, one or more other applicable processes, or a combination thereof.

Afterwards, a redistribution structure 732 is formed over the protective layer 730, as shown in FIG. 7E in accordance with some embodiments. Similar to the redistribution structure 102 shown in FIG. 1A, the redistribution structure 732 includes insulating layers 734 and conductive features 736. The material and formation method of the redistribution structure 732 may be the same as or similar to those of the redistribution structure 102 illustrated in FIG. 1A.

Figure 7F:
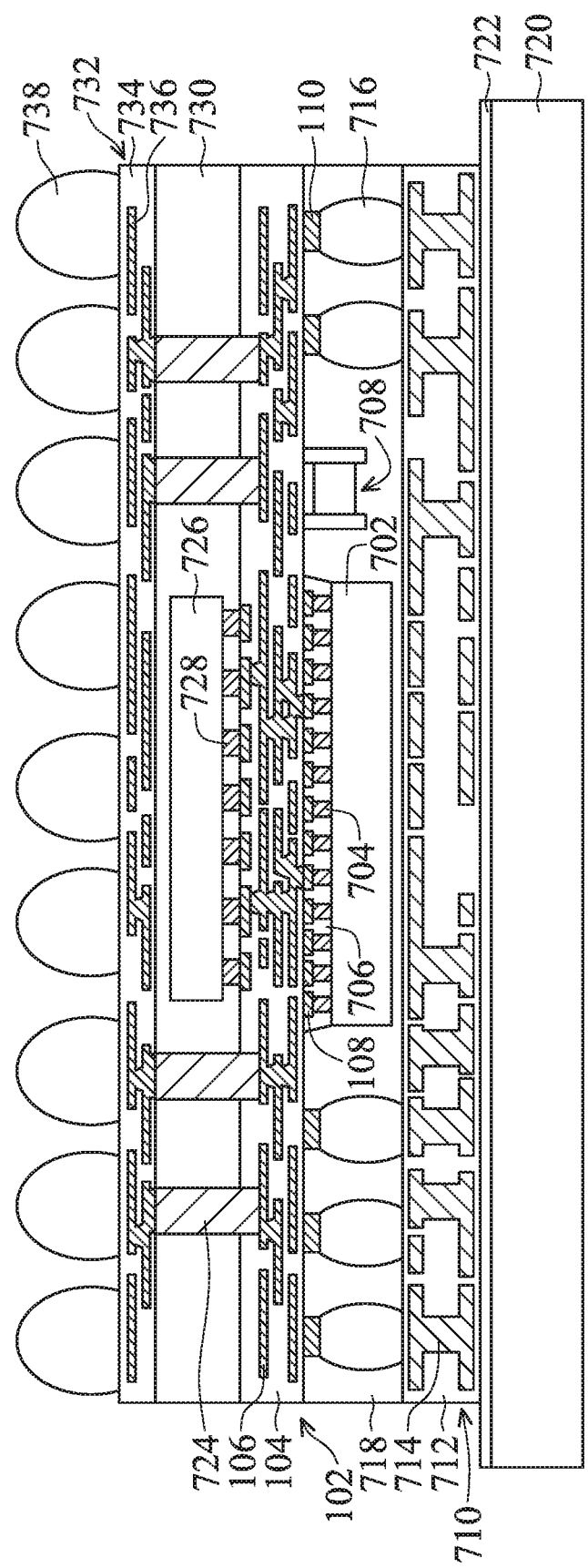

As shown in FIG. 7F, conductive bumps 738 are formed over the redistribution structure 732, in accordance with some embodiments. Each of the conductive bumps 738 may be electrically connected to one of the conductive features 736 of the redistribution structure 732. The material and formation method of the conductive bumps 738 may be the same as or similar to those of the conductive bumps 146 illustrated in FIG. 1G.

Figure 7G:
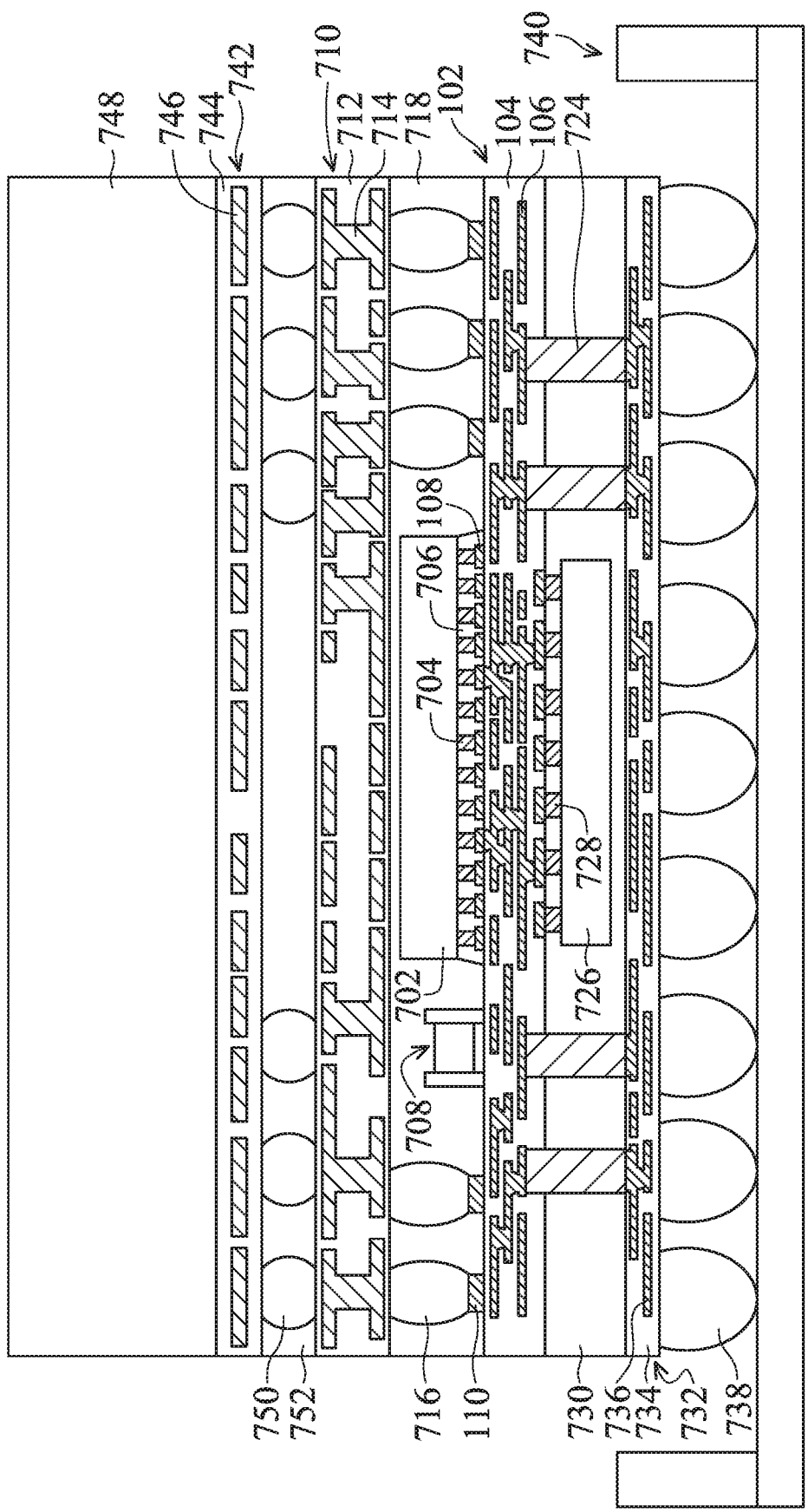

As shown in FIG. 7G, the structure shown in FIG. 7F is turned upside down and attached onto a tape carrier 740, in accordance with some embodiments. Afterwards, the carrier substrate 720 and the release film 722 are removed. As a result, the surface of the interposer substrate 710 that is originally covered by the carrier substrate 720 is exposed, as shown in FIG. 7G.

Afterwards, a module 748 carried by an interconnection structure 742 is stacked over the interposer substrate 710, as shown in FIG. 7G in accordance with some embodiments. In some embodiments, the module 748 is bonded to the interposer substrate 710 through conductive structures 750. The conductive structures 750 may include solder bumps, conductive pillars, other suitable conductive elements, or a combination thereof. In some embodiments, the interconnection structure 742 is separated from the interposer substrate 710 by a gap, as shown in FIG. 7G. In some embodiments, an underfill material 752 is formed to fill the gap and protect the conductive structures 750.

In some embodiments, the module 748 is a package module that has one or more semiconductor dies. For example, the package module includes memory dies. In some embodiments, the module 748 is a semiconductor die. For example, the semiconductor die includes memory devices.

In some embodiments, the interconnection structure 742 is an interposer substrate that carries the module 748. In these cases, the interconnection structure 742 has a structure that is similar to that of the interposer substrate 122 shown in FIG. 1C. In some embodiments, the interconnection structure 742 includes a board 744 and conductive elements 746. The material of the board 744 may be the same as or similar to that of the board 124 of the interposer substrate 122. The material of the conductive elements 746 may be the same as or similar to that of the conductive elements 126 of the interposer substrate 122.

However, embodiments of the disclosure are not limited thereto. Many variations and/or modifications can be made to embodiments of the disclosure. In some other embodiments, the interconnection structure 742 has a structure that is similar to that of the redistribution structure 102.

In some embodiments, a singulation process is then carried out. As a result, multiple separate package structures are formed. The package structures may then be removed from the tape carrier.

Figure 8A:
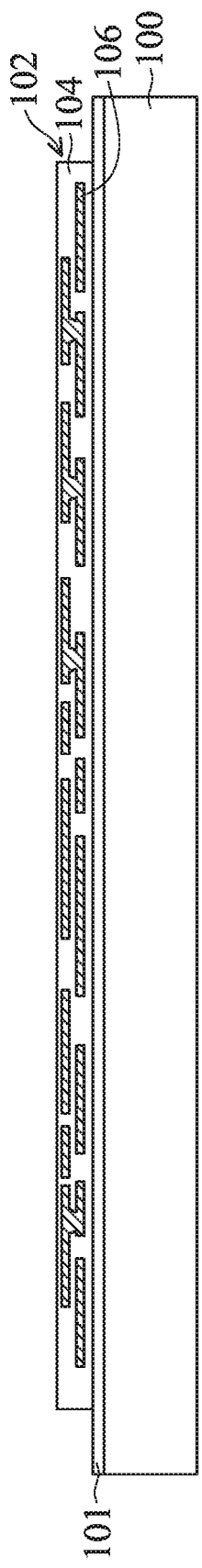
FIGS. 8A-8G are cross-sectional views of various stages of a process for forming a package structure, in accordance with some embodiments.

Many variations and/or modifications can be made to embodiments of the disclosure. FIGS. 8A-8G are cross-sectional views of various stages of a process for forming a package structure, in accordance with some embodiments. As shown in FIG. 8A, similar to the embodiments shown in FIG. 7A, the redistribution structure 102 is formed over the carrier substrate 100. The release film 101 between the redistribution structure 102 and the carrier substrate 100 is used to facilitate a subsequent separation process between the carrier substrate 100 and the redistribution structure 102.

Figure 8B:
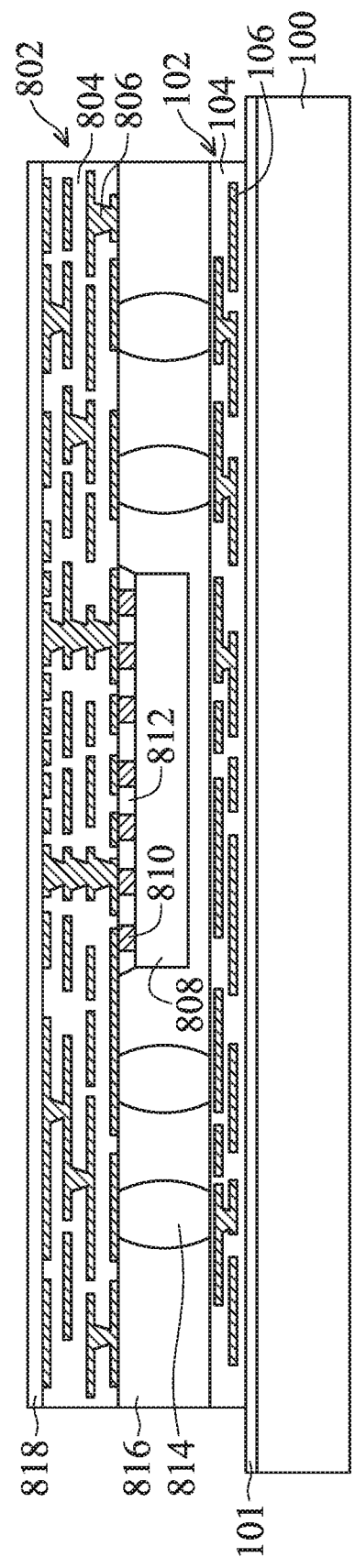

As shown in FIG. 8B, an interposer substrate 802 is stacked over the redistribution structure 102, in accordance with some embodiments. In some embodiments, before the interposer substrate 802 is stacked, a semiconductor die 808 is bonded onto the interposer substrate 802 through conductive features 810. An underfill material 812 is formed to surround and protect the conductive features 810. During the stacking of the interposer substrate 802, the semiconductor die 808 is disposed over the redistribution structure 102 and positioned between the interposer substrate 802 and the redistribution structure 102. In some embodiments, the interposer substrate 802 extends across edges of the semiconductor die 808. In some embodiments, the interposer substrate 802 is wider than the semiconductor die 808.

In some embodiments, the interposer substrate 802 is bonded to the redistribution structure 102 through conductive structures 814, as shown in FIG. 8B. The conductive structures 814 may include solder bumps, conductive pillars, other suitable conductive elements, or a combination thereof. Each of the conductive structures 814 may be electrically connected to one of the conductive features 106 of the redistribution structure 102. In some embodiments, after the interposer substrate 802 is bonded onto the redistribution structure 102, the semiconductor die 808 is separated from the redistribution structure 102 by a gap, as shown in FIG. 8B.

In some embodiments, the interposer substrate 802 includes a board 804 and conductive elements 806. The material of the board 804 may be the same as or similar to that of the board 124 shown in FIG. 1C. The material of the conductive elements 806 may be the same as or similar to that of the conductive elements 126.

In some embodiments, the interposer substrate 802 and the carrier substrate 100 are pressed against each other at an elevated temperature. As a result, the interposer substrate 802 is bonded to the redistribution structure 102 through the conductive structures 814. In some embodiments, a thermal compression process is used to achieve the bonding process mentioned above.

As shown in FIG. 8B, a protective layer 816 is formed to surround and protect the semiconductor die 808, in accordance with some embodiments. In some embodiments, the protective layer 816 is between the interposer substrate 802 and the redistribution structure 102. In some embodiments, the protective layer 816 surrounds and protects the conductive structures 814. In some embodiments, a portion of the protective layer 816 is between the semiconductor die 808 and the redistribution structure 102, as shown in FIG. 8B. The material and formation method of the protective layer 816 may be the same as or similar to those of the protective layer 144 illustrated in FIG. 1F.

Afterwards, a dielectric layer 818 is formed over the interposer substrate 802, as shown in FIG. 8B in accordance with some embodiments. The dielectric layer 818 may be made of or include a polymer material. The polymer material may include polyimide, polybenzoxazole, one or more other suitable materials, or a combination thereof. Alternatively, the dielectric layer 818 may be made of or include silicon oxide, silicon nitride, silicon oxynitride, silicon carbide, one or more other suitable materials, or a combination thereof. The dielectric layer 818 may be formed using a spin coating process, a spray coating process, a CVD process, a lamination process, one or more other applicable processes, or a combination thereof.

In some embodiments, a planarization process is applied on the dielectric layer 818. As a result, the dielectric layer 818 has a substantially planar top surface, which facilitates subsequent processes. The planarization process may include a grinding process, a CMP process, an etching process, a dry polishing process, one or more other applicable processes, or a combination thereof.

Figure 8C:
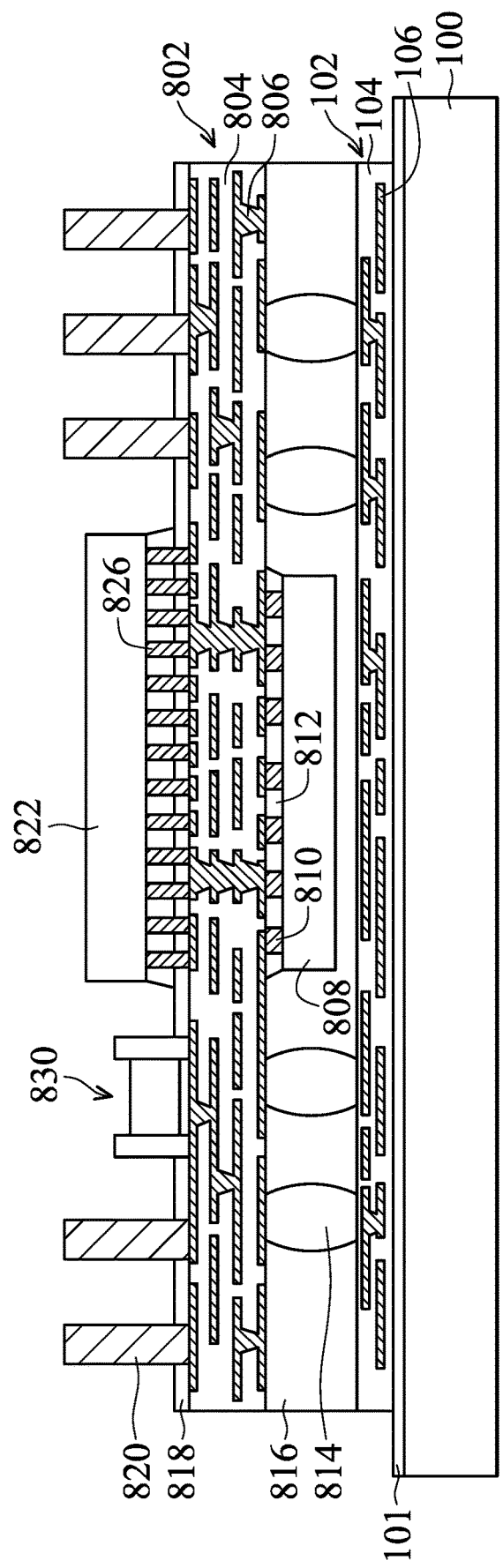

As shown in FIG. 8C, conductive pillars 820 are formed over the interposer substrate 802, in accordance with some embodiments. Each of the conductive pillars 820 is electrically connected to one of the conductive elements 806 of the interposer substrate 802. The material and formation method of the conductive pillars 820 may be the same as or similar to those of the conductive pillars 112 illustrated in FIG. 1A. In some embodiments, before the formation of the conductive pillars 820, a patterning process is used to form openings in the dielectric layer 818 to expose some of the conductive elements 806 of the interposer substrate 802. Some of the exposed conductive elements 806 are used to hold the conductive pillars 820. Some of the exposed conductive elements 806 may be used to hold a subsequently stacked semiconductor die and/or a subsequently stacked device element.

Afterwards, a semiconductor die 822 is stacked over the interposer substrate 802, as shown in FIG. 8C in accordance with some embodiments. In some embodiments, the semiconductor die 822 is bonded onto the interposer substrate 802 through conductive features 826. Each of the conductive features 826 may be electrically connected to one of the conductive elements 806 of the interposer substrate 802. In some embodiments, the conductive pillars 820 has a height that is taller than that of the semiconductor die 822, as shown in FIG. 8C. In some embodiments, a device element 830 is bonded to the interposer substrate 802. The device element 830 may include one or more passive devices and/or one or more memory devices.

Figure 8D:
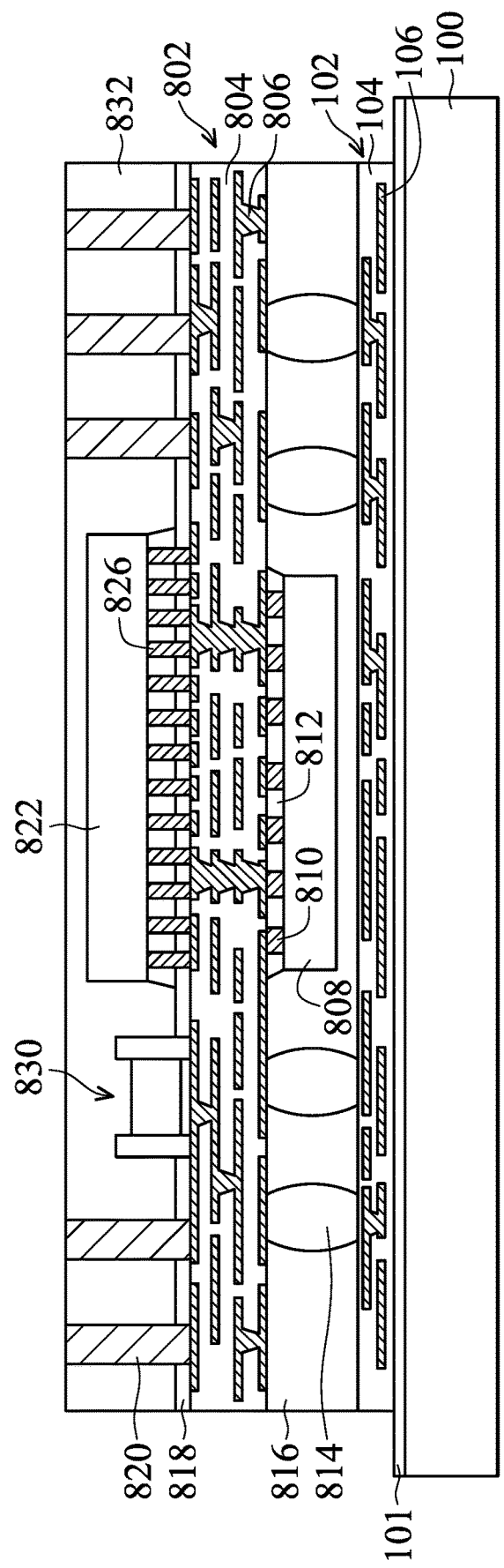

As shown in FIG. 8D, a protective layer 832 is formed to surround and protect the semiconductor die 822, the device element 830, and the conductive pillars 820, in accordance with some embodiments. The material and formation method of the protective layer 832 may be the same as or similar to those of the protective layer 144 illustrated in FIG. 1F. In some embodiments, a planarization process is used to thin the protective layer 832. As a result, the protective layer 832 has a substantially planar top surface, which facilitates subsequent processes. In some embodiments, the top surface of the protective layer 832 is substantially level with the top surfaces of the conductive pillars 820. The planarization process may include a grinding process, a CMP process, an etching process, a dry polishing process, one or more other applicable processes, or a combination thereof.

Figure 8E:
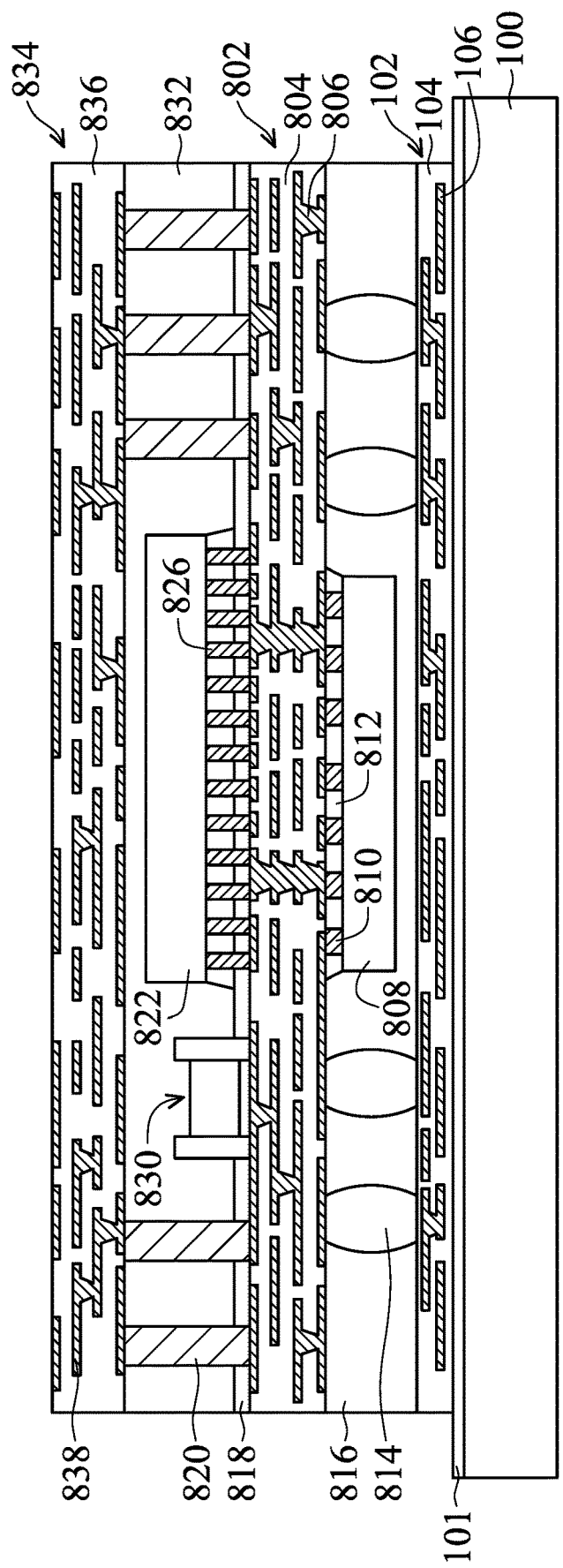

As shown in FIG. 8E, a redistribution structure 834 is formed over the protective layer 832 and the conductive pillars 820, in accordance with some embodiments. Similar to the redistribution structure 102 shown in FIG. 1A, the redistribution structure 834 includes insulating layers 836 and conductive features 838. The material and formation method of the redistribution structure 834 may be the same as or similar to those of the redistribution structure 102 illustrated in FIG. 1A.

Figure 8F:
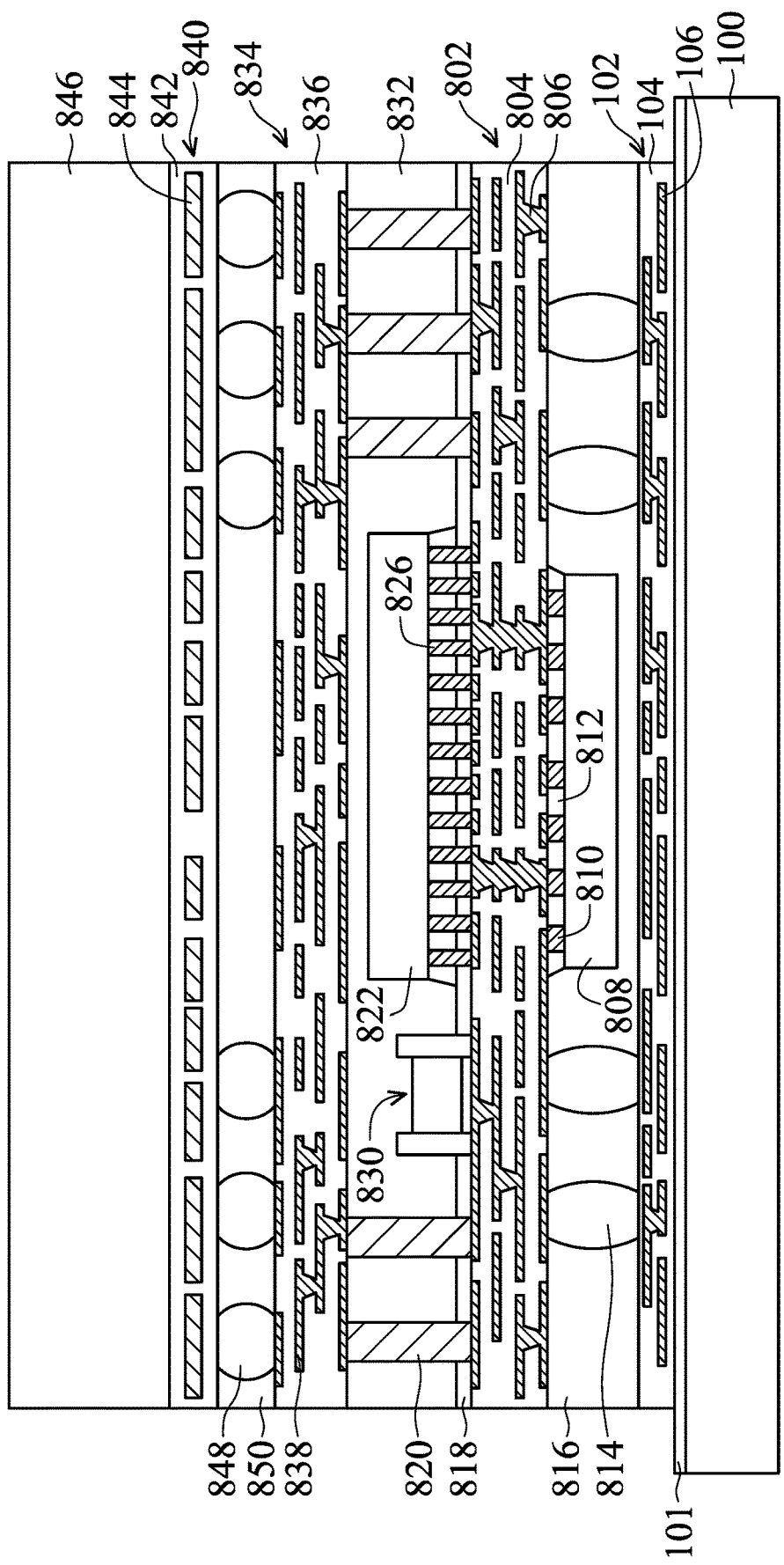

As shown in FIG. 8F, a module 846 carried by an interconnection structure 840 is stacked over the redistribution structure 834, in accordance with some embodiments. In some embodiments, the module 846 is bonded to the redistribution structure 834 through conductive structures 848. The conductive structures 848 may include solder bumps, conductive pillars, other suitable conductive elements, or a combination thereof. In some embodiments, the interconnection structure 840 is separated from the redistribution structure 834 by a gap, as shown in FIG. 8F. In some embodiments, an underfill material 850 is formed to fill the gap and protect the conductive structures 848.

In some embodiments, the module 846 is a package module that has one or more semiconductor dies. For example, the package module includes memory dies. In some embodiments, the module 846 is a semiconductor die. For example, the semiconductor die includes memory devices.

In some embodiments, the interconnection structure 840 is an interposer substrate that carries the module 846. In these cases, the interconnection structure 840 has a structure that is similar to that of the interposer substrate 122 shown in FIG. 1C. In some embodiments, the interconnection structure 840 includes a board 842 and conductive elements 844. The material of the board 842 may be the same as or similar to that of the board 124 of the interposer substrate 122. The material of the conductive elements 844 may be the same as or similar to that of the conductive elements 126 of the interposer substrate 122.

However, embodiments of the disclosure are not limited thereto. Many variations and/or modifications can be made to embodiments of the disclosure. In some other embodiments, the interconnection structure 840 has a structure that is similar to that of the redistribution structure 102.

Figure 8G:
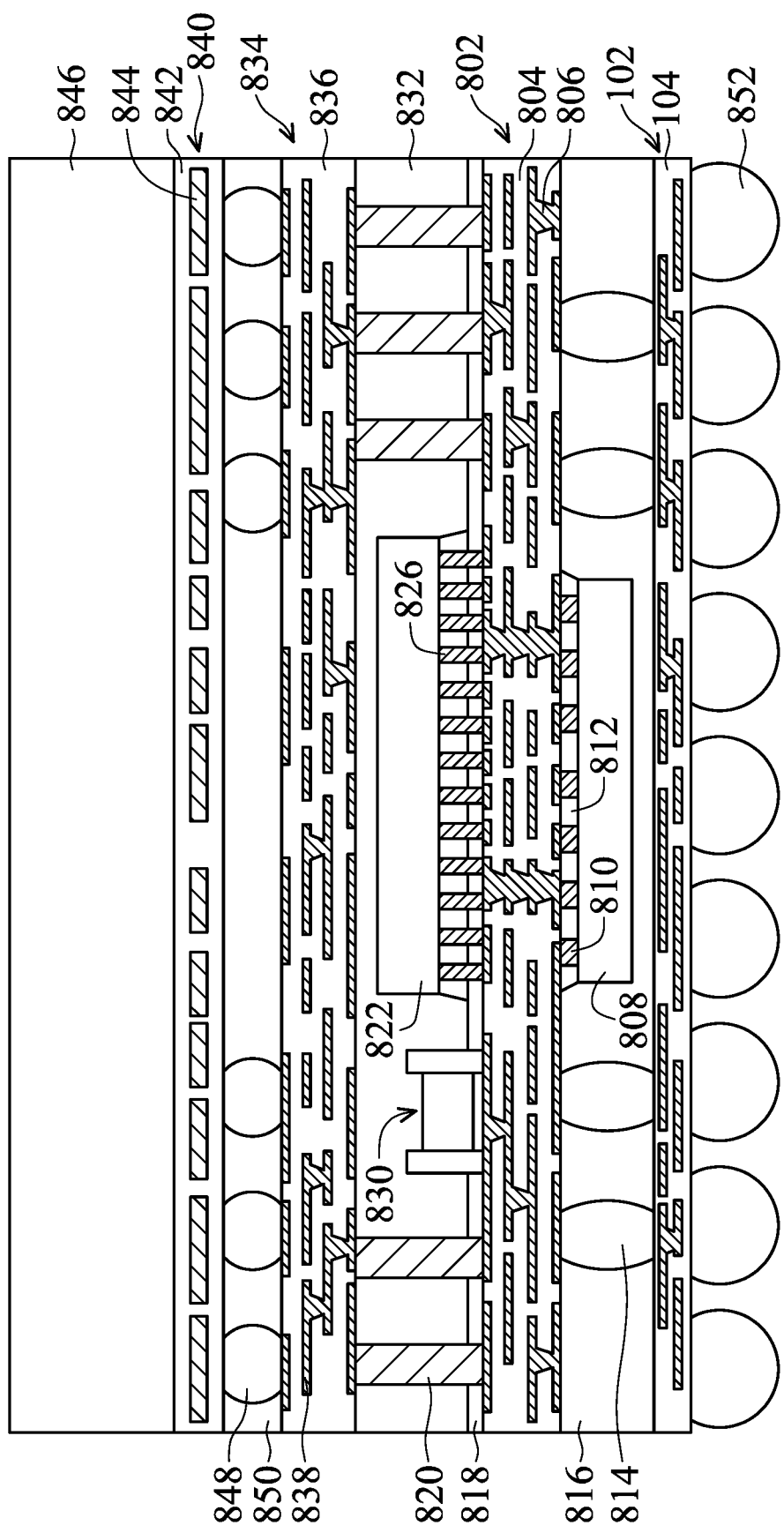

As shown in FIG. 8G, the carrier substrate 100 and the release film 101 are removed, and conductive bumps 852 are then formed over the redistribution structure 102, in accordance with some embodiments. Each of the conductive bumps 852 may be electrically connected to one of the conductive features 106 of the redistribution structure 102. The material and formation method of the conductive bumps 852 may be the same as or similar to those of the conductive bumps 146 illustrated in FIG. 1G.

In some embodiments, a singulation process is then carried out. As a result, multiple separate package structures are formed. In FIG. 8G, one of the package structures is shown.

Figure 9:
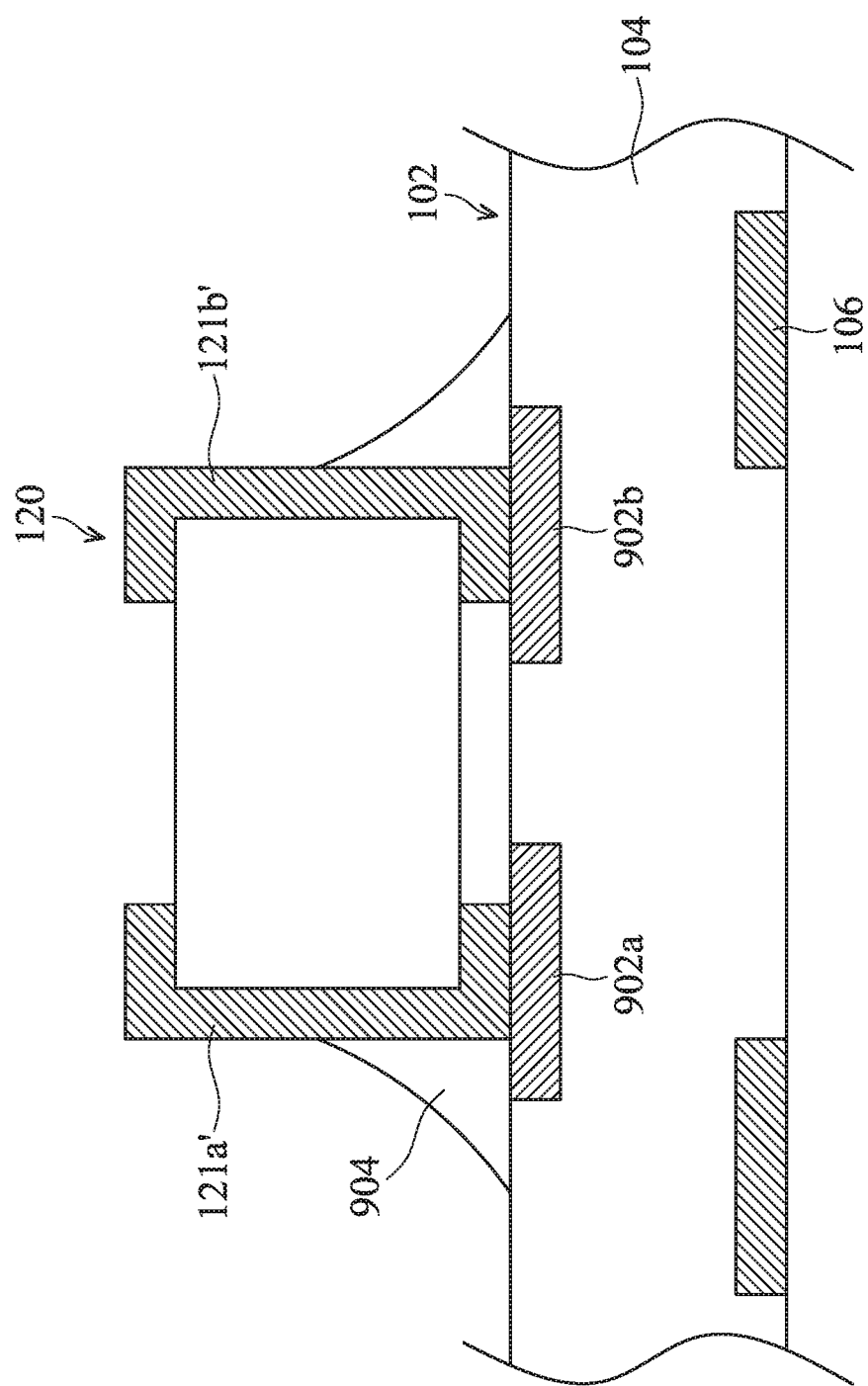
FIG. 9 is a cross-sectional view of a package structure, in accordance with some embodiments.

FIG. 9 is a cross-sectional view of a package structure, in accordance with some embodiments. In some embodiments, FIG. 9 is an enlarged view showing the package structure near the device element 120. Other device elements shown in FIGS. 1-8 may have the same or similar structure shown in FIG. 9. As shown in FIG. 9, in some embodiments, the device element 120 includes electrodes 121a' and 121b'. In some embodiments, the cross-sectional view of the electrodes 121a' and 121b' have C-shape profile, as shown in FIG. 9. The electrodes 121a' and 121b' may be bonded to pad regions 902a and 902b formed in the redistribution structure 102. In some embodiments, an underfill element 904 is formed to surround and protect the joint between the electrodes 121a' and 121b' and the pad regions 902a and 902b.

Embodiments of the disclosure form a package structure including a redistribution structure, an interposer substrate, and a semiconductor die between the redistribution structure and the interposer substrate. One or more conductive features are disposed between the redistribution structure and the interposer substrate. A protective layer is used to surround and protect the conductive features and the semiconductor die. Multiple semiconductor dies and/or device elements are bonded onto the redistribution structure and/or the interposer substrate. The signal transmission efficiency is significantly improved. The reliability and performance of the package structure are therefore improved.

In accordance with some embodiments, a method for forming a package structure is provided. The method includes forming a redistribution structure over a carrier substrate and disposing a semiconductor die over the redistribution structure. The method also includes stacking an interposer substrate over the redistribution structure. The interposer substrate extends across edges of the semiconductor die. The method further includes disposing one or more device elements over the interposer substrate. In addition, the method includes forming a protective layer to surround the semiconductor die.

In accordance with some embodiments, a method for forming a package structure is provided. The method includes stacking a first semiconductor die over a redistribution structure and bonding an interposer substrate over the redistribution structure. The interposer substrate is wider than the first semiconductor die. The method also includes stacking a second semiconductor die over the interposer substrate. The method further includes forming a protective layer to surround the first semiconductor die.

In accordance with some embodiments, a package structure is provided. The package structure includes a redistribution structure and an interposer substrate over the redistribution structure. The interposer substrate contains more filler than the redistribution structure. The package structure also includes a semiconductor die between the redistribution structure and the interposer substrate. The package structure further includes a protective layer surrounding the semiconductor die. A portion of the protective layer is between the semiconductor die and the interposer substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
    forming a first redistribution structure over a carrier substrate;
    disposing a first semiconductor die over an interposer substrate,
    subsequently stacking the interposer substrate over the first redistribution structure and the carrier substrate, wherein the interposer substrate extends across edges of the first semiconductor die, the first semiconductor die is disposed over the interposer substrate prior to stacking the interposer substrate over the first redistribution structure, and the first redistribution structure and the carrier substrate are positioned at a same side of the first semiconductor die;
    disposing at least one device element over the interposer substrate;
    disposing a second redistribution structure over the device element;
    forming a first protective layer to surround the first semiconductor die connecting the first redistribution structure and the interposer substrate; and
    forming a second protective layer to surround the device element, wherein the device element and the second redistribution structure are separated by the second protective layer.

2. The method for forming a package structure as claimed in claim 1, further comprising stacking a package module over the first redistribution structure, wherein the package module extends across edges of the interposer substrate.

3. The method for forming a package structure as claimed in claim 2, wherein the first protective layer is formed before the package module is stacked.

4. The method for forming a package structure as claimed in claim 1, wherein the interposer substrate contains more filler than the first redistribution structure.

5. The method for forming a package structure as claimed in claim 1, further comprising stacking a second semiconductor die over the first redistribution structure such that the first semiconductor die is between the first redistribution structure and the second semiconductor die.

6. The method for forming a package structure as claimed in claim 1, wherein the interposer substrate is directly below a package module.

7. The method for forming a package structure as claimed in claim 1, further comprising stacking a second semiconductor die over the interposer substrate such that the interposer substrate is between the first semiconductor die and the second semiconductor die.

8. The method for forming a package structure as claimed in claim 7, further comprising:
    forming a second redistribution structure over the second protective layer and the second semiconductor die.

9. The method for forming a package structure as claimed in claim 8, further comprising stacking a package module over the second redistribution structure.

10. A method for forming a package structure, comprising:
    stacking a first semiconductor die over an interposer substrate, wherein a first conductive structure directly connects to the interposer substrate and the first semiconductor die;
    forming a first protective layer to surround the first semiconductor die over the interposer substrate;
    bonding the interposer substrate to a first redistribution structure disposed on a carrier substrate with the first protective layer, wherein the interposer substrate is wider than the first semiconductor die;
    subsequently stacking a second semiconductor die and a device element over the interposer substrate on an opposite side of the first semiconductor die, wherein a second conductive structure directly connects to the interposer substrate and the second semiconductor die; and
    forming a second protective layer to surround the second semiconductor die and the device element.

11. The method for forming a package structure as claimed in claim 10, further comprising bonding a package module over the first redistribution structure, wherein the package module extends across edges of the interposer substrate.

12. The method for forming a package structure as claimed in claim 11, wherein the first protective layer is formed before the package module is bonded over the first redistribution structure.

13. A method for forming a package structure, comprising:
    forming a first redistribution structure over a carrier substrate;
    disposing a first semiconductor die and at least one conductive bump structure on a first side of an interposer substrate;
    subsequently stacking the interposer substrate over the first redistribution structure and the carrier substrate, wherein the at least one conductive bump structure directly connects the interposer substrate and the first redistribution structure;

disposing a second semiconductor die and at least one conductive pillar structure directly on a second side of the interposer substrate, wherein a portion of the first semiconductor die overlaps the second semiconductor die in a normal direction of the carrier substrate, and the first redistribution structure is between the second semiconductor die and the carrier substrate.

14. The method for forming a package structure as claimed in claim 13, further comprising forming a first protective layer surrounding the first semiconductor die between the first redistribution structure and the interposer substrate.

15. The method for forming a package structure as claimed in claim 14, further comprising forming a second protective layer surrounding the second semiconductor die.

16. The method for forming a package structure as claimed in claim 14, wherein the first protective layer is formed prior to stacking the interposer substrate over the first redistribution structure and the carrier substrate.

17. The method for forming a package structure as claimed in claim 13, further comprising forming a device element on the second side of the interposer substrate adjacent to the second semiconductor die.

18. The method for forming a package structure as claimed in claim 13, further comprising forming a package module on the second protective layer, wherein the package module is wider than the first semiconductor die.

19. The method for forming a package structure as claimed in claim 13, further comprising forming a second redistribution structure over the interposer substrate, wherein the second redistribution structure and the interposer substrate are disposed on opposite sides of the second semiconductor die, and a portion of the second protective layer extends between the second semiconductor die and the second redistribution structure in the normal direction of the carrier substrate.

20. The method for forming a package structure as claimed in claim 13, wherein the interposer substrate is wider than the first semiconductor die.

* * * * *